(12) United States Patent
Tsai et al.

(10) Patent No.: US 11,682,599 B2
(45) Date of Patent: Jun. 20, 2023

(54) CHIP PACKAGE STRUCTURE WITH MOLDING LAYER AND METHOD FOR FORMING THE SAME

(71) Applicant: Taiwan Semiconductor Manufacturing Co., Ltd., Hsinchu (TW)

(72) Inventors: Po-Hao Tsai, Zhongli (TW); Techi Wong, Zhubei (TW); Meng-Wei Chou, Zhubei (TW); Meng-Liang Lin, Hsinchu (TW); Po-Yao Chuang, Hsin-Chu (TW); Shin-Puu Jeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/199,535

(22) Filed: Nov. 26, 2018

(65) Prior Publication Data

US 2020/0006176 A1      Jan. 2, 2020

Related U.S. Application Data

(60) Provisional application No. 62/690,412, filed on Jun. 27, 2018.

(51) Int. Cl.
*H01L 23/31* (2006.01)
*H01L 23/498* (2006.01)
*H01L 21/48* (2006.01)
*H01L 21/56* (2006.01)
*H01L 23/538* (2006.01)

(52) U.S. Cl.
CPC ...... *H01L 23/3114* (2013.01); *H01L 21/4857* (2013.01); *H01L 21/563* (2013.01); *H01L 23/3128* (2013.01); *H01L 23/49822* (2013.01); *H01L 23/5389* (2013.01)

(58) Field of Classification Search
CPC ....... H01L 23/31; H01L 21/48; H01L 23/498; H01L 23/538
USPC ....................................................... 257/687
See application file for complete search history.

(56) References Cited

U.S. PATENT DOCUMENTS

| | | | | |
|---|---|---|---|---|
| 2003/0106212 A1* | 6/2003 | Chao | ...... | H01L 21/565 29/848 |
| 2004/0056344 A1* | 3/2004 | Ogawa | ...... | H01L 25/50 257/686 |
| 2005/0047094 A1* | 3/2005 | Hsu | ...... | H01L 23/367 361/704 |
| 2013/0049195 A1* | 2/2013 | Wu | ...... | H01L 21/561 257/738 |

(Continued)

FOREIGN PATENT DOCUMENTS

| | | | |
|---|---|---|---|
| CN | 104810356 | * | 7/2015 |
| EP | 1780790 | * | 2/2007 |

*Primary Examiner* — Sheng-Bai Zhu
(74) *Attorney, Agent, or Firm* — McClure, Qualey & Rodack, LLP

(57) ABSTRACT

A method for forming a chip package structure is provided. The method includes disposing a chip over a redistribution structure. The method includes forming a molding layer over the redistribution structure and adjacent to the chip. The method includes partially removing the molding layer to form a trench in the molding layer, and the trench is spaced apart from the chip.

14 Claims, 31 Drawing Sheets

(56) References Cited

U.S. PATENT DOCUMENTS

| | | | |
|---|---|---|---|
| 2013/0175694 A1* | 7/2013 | Shih | H01L 21/568 |
| | | | 257/773 |
| 2013/0175706 A1* | 7/2013 | Choi | H01L 24/24 |
| | | | 257/777 |
| 2013/0292848 A1* | 11/2013 | Na | H01L 23/36 |
| | | | 257/774 |
| 2014/0077349 A1* | 3/2014 | Higgins, III | H01L 24/13 |
| | | | 257/692 |
| 2015/0221625 A1* | 8/2015 | Chun | H01L 23/367 |
| | | | 257/707 |
| 2016/0276308 A1* | 9/2016 | Min | H01L 23/367 |
| 2017/0221788 A1* | 8/2017 | Yeh | H01L 23/367 |
| 2017/0345736 A1* | 11/2017 | Miyairi | H01L 23/42 |

\* cited by examiner

CHIP PACKAGE STRUCTURE WITH MOLDING LAYER AND METHOD FOR FORMING THE SAME

PRIORITY CLAIM AND CROSS-REFERENCE

This Application claims the benefit of U.S. Provisional Application No. 62/690,412, filed on Jun. 27, 2018, and entitled "CHIP PACKAGE STRUCTURE WITH MOLDING LAYER AND METHOD FOR FORMING THE SAME", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits are typically manufactured on a semiconductor wafer. The semiconductor wafer may be singulated into dies. The dies may be packaged, and various technologies have been developed for packaging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1E-1 is a top view of the chip package structure of FIG. 1E, in accordance with some embodiments.

FIG. 1E-2 is a top view of the chip package structure of FIG. 1E, in accordance with some embodiments.

FIG. 1E-3 is a top view of the chip package structure of FIG. 1E, in accordance with some embodiments.

FIG. 1K-1 is a top view of the chip package structure of FIG. 1K, in accordance with some embodiments.

FIG. 1L-1 is a top view of the chip package structure of FIG. 1L, in accordance with some embodiments.

FIG. 2 is a cross-sectional view illustrating a chip package structure, in accordance with some embodiments.

FIG. 3 is a cross-sectional view illustrating a chip package structure, in accordance with some embodiments.

FIGS. 7A-1 to 7B-1 are top views of the chip package structures of FIGS. 7A-7B, in accordance with some embodiments.

FIGS. 9A-1 to 9B-1 are top views of the chip package structures of FIGS. 9A-9B, in accordance with some embodiments.

DETAILED DESCRIPTION

Figure 1A:
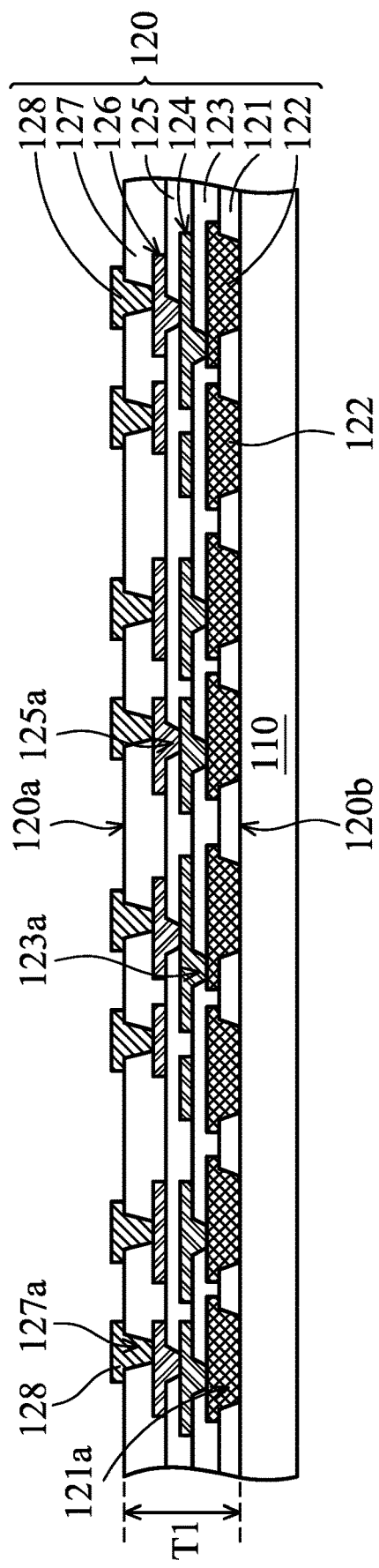
FIGS. 1A-1L are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1L are cross-sectional views of various stages of a process for forming a chip package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments.

The carrier substrate 110 includes glass, silicon, silicon oxide, aluminum oxide, metal, a combination thereof, and/or the like, in accordance with some embodiments. The carrier substrate 110 includes a metal frame, in accordance with some embodiments. As shown in FIG. 1A, a redistribution structure 120 is formed over the carrier substrate 110, in accordance with some embodiments. The redistribution structure 120 has two opposite surfaces 120a and 120b, in accordance with some embodiments. The redistribution structure 120 has a thickness T1 ranging from about 2 nm to about 10 nm, in accordance with some embodiments.

The formation of the redistribution structure 120 includes forming an insulating layer 121 over the carrier substrate 110; forming conductive pads 122 over the insulating layer 121 and in through holes 121a of the insulating layer 121;

forming an insulating layer 123 over the insulating layer 121 and the conductive pads 122; forming a wiring layer 124 over the insulating layer 123 and in through holes 123a of the insulating layer 123; forming an insulating layer 125 over the insulating layer 123 and the wiring layer 124; forming a wiring layer 126 over the insulating layer 125 and in through holes 125a of the insulating layer 125; forming an insulating layer 127 over the insulating layer 125 and the wiring layer 126; and forming conductive pads 128 over the insulating layer 127 and in through holes 127a of the insulating layer 127.

The wiring layers 124 and 126 are electrically connected to each other, in accordance with some embodiments. The conductive pads 122 and 128 are electrically connected to the wiring layers 124 and 126, in accordance with some embodiments.

The insulating layers 121, 123, 125, and 127 are made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The wiring layers 124 and 126 and the conductive pads 122 and 128 are made of a conductive material, such as metal (e.g. copper, aluminum, or tungsten), in accordance with some embodiments.

Figure 1B:
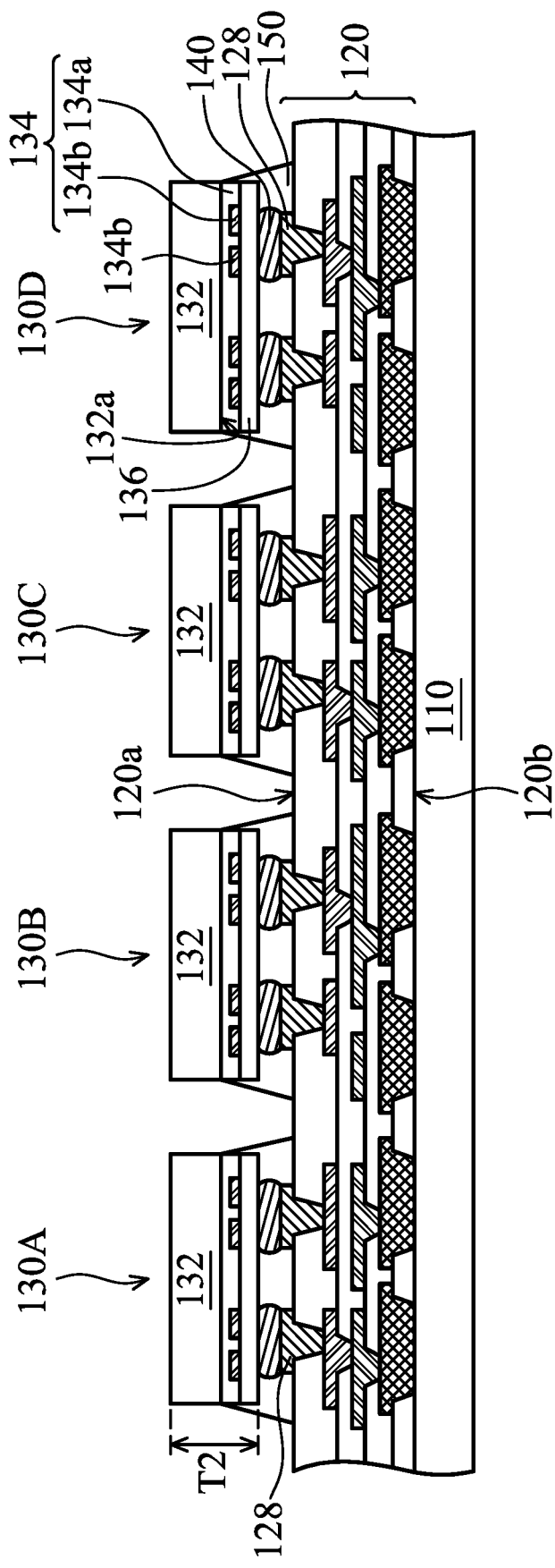

As shown in FIG. 1B, chips 130A, 130B, 130C, and 130D are bonded to the redistribution structure 120 through conductive bumps 140, in accordance with some embodiments. Each of the chips 130A, 130B, 130C, and 130D includes a system-on-chip (SoC), a memory chip (e.g., a dynamic random access memory chip), or another suitable chip. The chips 130A, 130B, 130C, and 130D are also referred to as electronic devices, in accordance with some embodiments.

The chips 130A, 130B, 130C, and 130D may have the same or different widths. The chips 130A, 130B, 130C, and 130D may have the same or different heights. Each of the chips 130A, 130B, 130C, and 130D has a substrate 132, a device layer 134, and an interconnect layer 136, in accordance with some embodiments.

In some embodiments, the substrate 132 is made of an elementary semiconductor material including silicon or germanium in a single crystal, polycrystal, or amorphous structure. In some other embodiments, the substrate 132 is made of a compound semiconductor, such as silicon carbide, gallium arsenide, gallium phosphide, indium phosphide, indium arsenide, an alloy semiconductor, such as SiGe, or GaAsP, or a combination thereof.

The substrate 132 may also include multi-layer semiconductors, semiconductor on insulator (SOI) (such as silicon on insulator or germanium on insulator), or a combination thereof. The chip 130A, 130B, 130C, or 130D has a thickness T2 greater than or equal to 500 μm, in accordance with some embodiments.

The substrate 132 has a bottom surface 132a facing the redistribution structure 120, in accordance with some embodiments. The device layer 134 is over the bottom surface 132a, in accordance with some embodiments. The device layer 134 includes electronic elements (not shown), a dielectric layer 134a, and conductive pads 134b, in accordance with some embodiments.

In some embodiments, electronic elements are formed on or in the substrate 132. The electronic elements include active elements (e.g. transistors, diodes, or the like) and/or passive elements (e.g. resistors, capacitors, inductors, or the like), in accordance with some embodiments. The dielectric layer 134a is formed over the bottom surface 132a and covers the electronic elements, in accordance with some embodiments.

The conductive pads 134b are embedded in the dielectric layer 134a and are electrically connected to the electronic elements, in accordance with some embodiments. The conductive pads 134b are made of a conductive material, such as metal (e.g., copper, aluminum, nickel, or combinations thereof), in accordance with some embodiments.

The interconnect layer 136 is formed over the device layer 134, in accordance with some embodiments. The interconnect layer 136 includes an interconnect structure (not shown) and a dielectric layer (not shown), in accordance with some embodiments. The interconnect structure is in the dielectric layer and electrically connected to the conductive pads 134b, in accordance with some embodiments. In some other embodiments, the chips 130A, 130B, 130C, and 130D are chip packages, which include a dynamic random access memory (DRAM) chip or a high bandwidth memory (HBM) chip.

The conductive bumps 140 are between the conductive pads 128 and the interconnect layer 136 to electrically connect the conductive pads 128 to the conductive pads 134b through the interconnect structure of the interconnect layer 136, in accordance with some embodiments. The conductive bumps 140 are made of a solder material, such as Sn and Ag or another suitable conductive material (e.g., gold), in accordance with some embodiments. The conductive bumps 140 are solder balls, in accordance with some embodiments.

As shown in FIG. 1B, an underfill layer 150 is formed between the chips 130A, 130B, 130C, and 130D and the redistribution structure 120, in accordance with some embodiments. The underfill layer 150 surrounds the conductive bumps 140 and the conductive pads 128, in accordance with some embodiments. The underfill layer 150 is made of an insulating material, such as a polymer material or a molding compound material consisting of epoxy and filler material, in accordance with some embodiments.

Figure 1C:
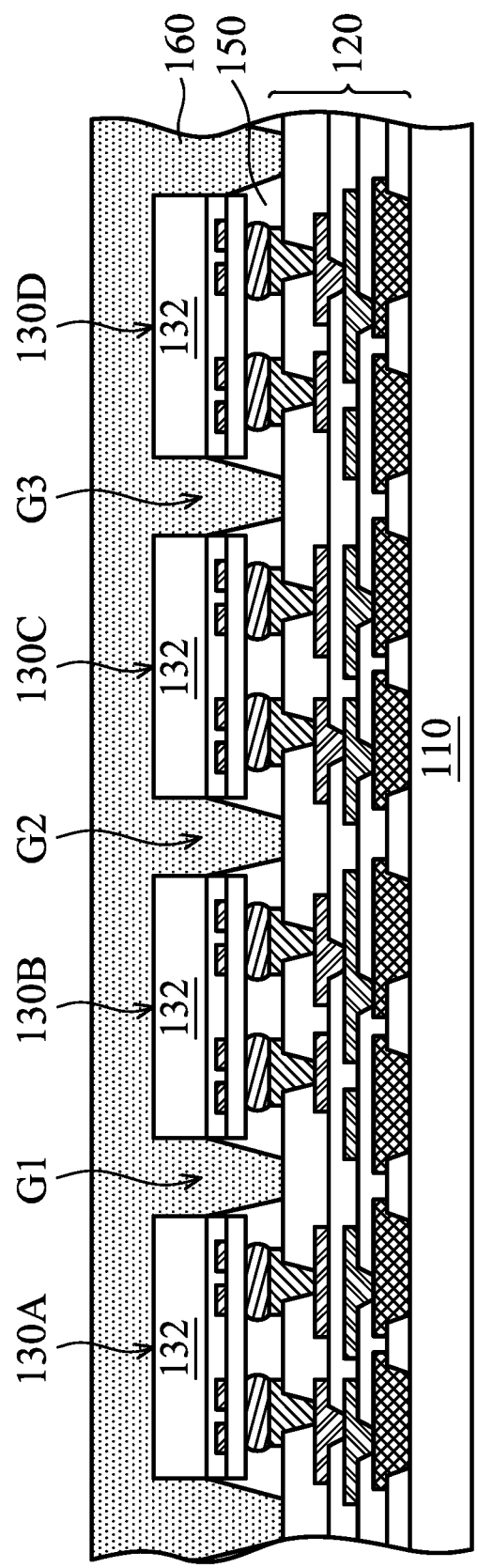

As shown in FIG. 1C, a molding layer 160 is formed over the chips 130A, 130B, 130C, and 130D, the underfill layer 150, and the redistribution structure 120, in accordance with some embodiments. The molding layer 160 fills gaps G1, G2, and G3 between the chips 130A, 130B, 130C, and 130D, in accordance with some embodiments. The molding layer 160 in the gaps G1, G2, and G3 surrounds the chips 130A, 130B, 130C, and 130D, in accordance with some embodiments. The molding layer 160 is made of a polymer material or another suitable insulating material. In some embodiments, a thermal process is performed on the molding layer 160 to cure the molding layer 160.

Figure 1D:
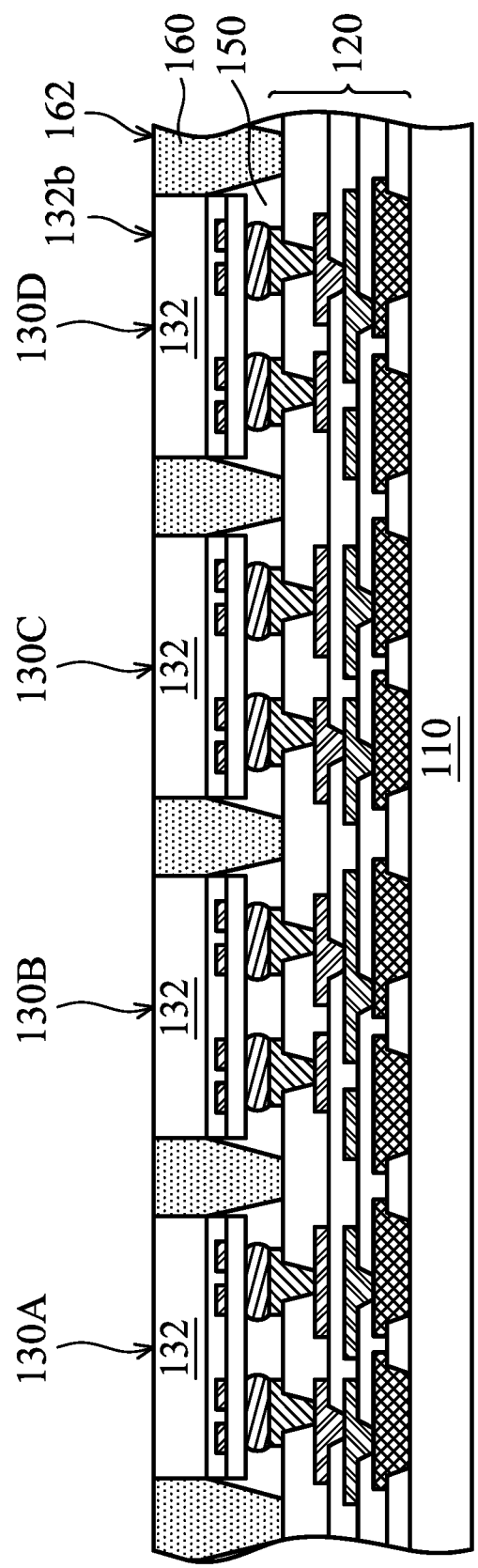

As shown in FIG. 1D, an upper portion of the molding layer 160 is removed, in accordance with some embodiments. After the removal process, a top surface 162 of the molding layer 160 is substantially coplanar with or aligned with the top surface 132b of the substrate 132, in accordance with some embodiments. The removal process includes a chemical mechanical polishing process, in accordance with some embodiments.

Figure 1E:
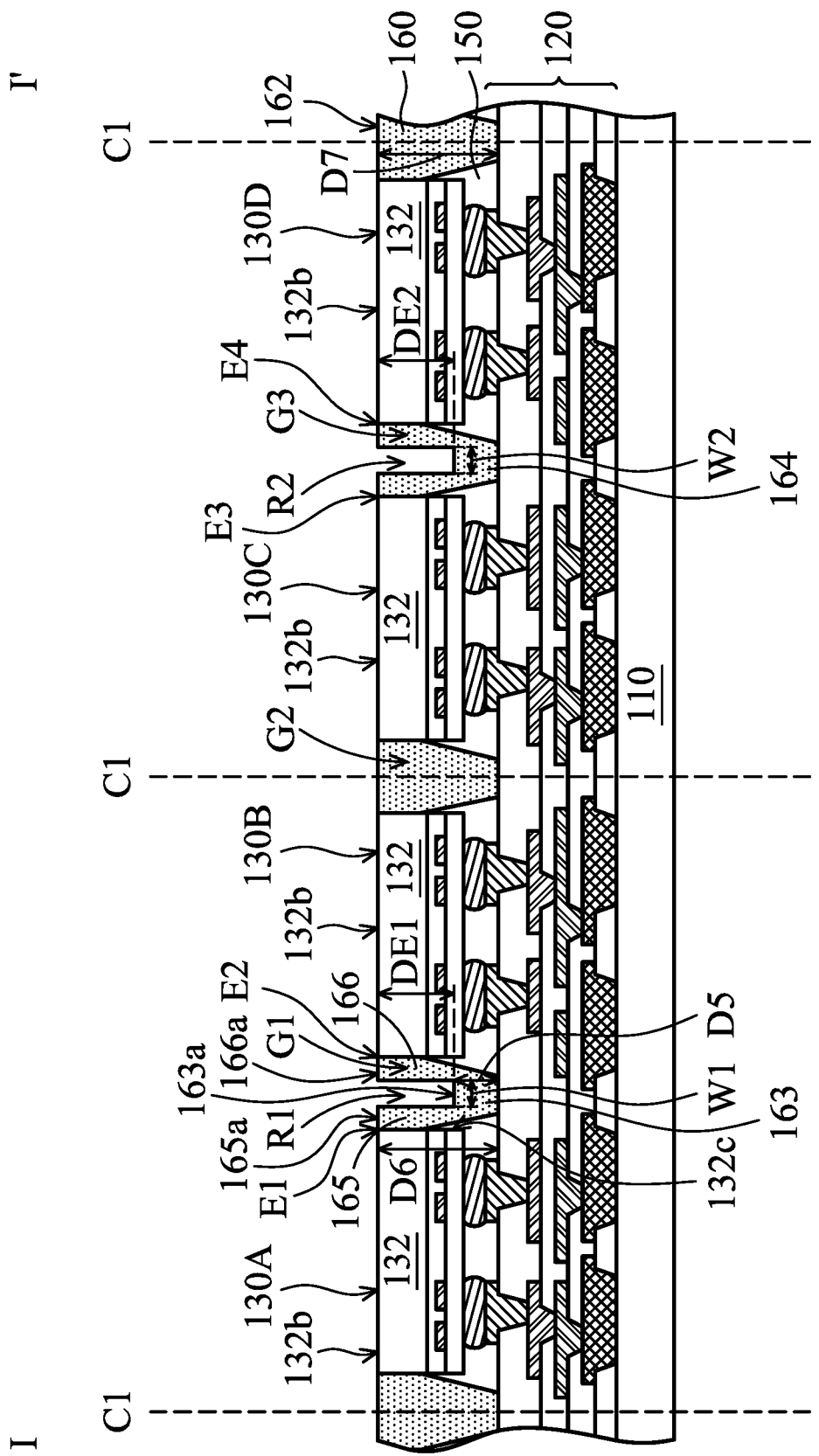
Figures 1, 1E:
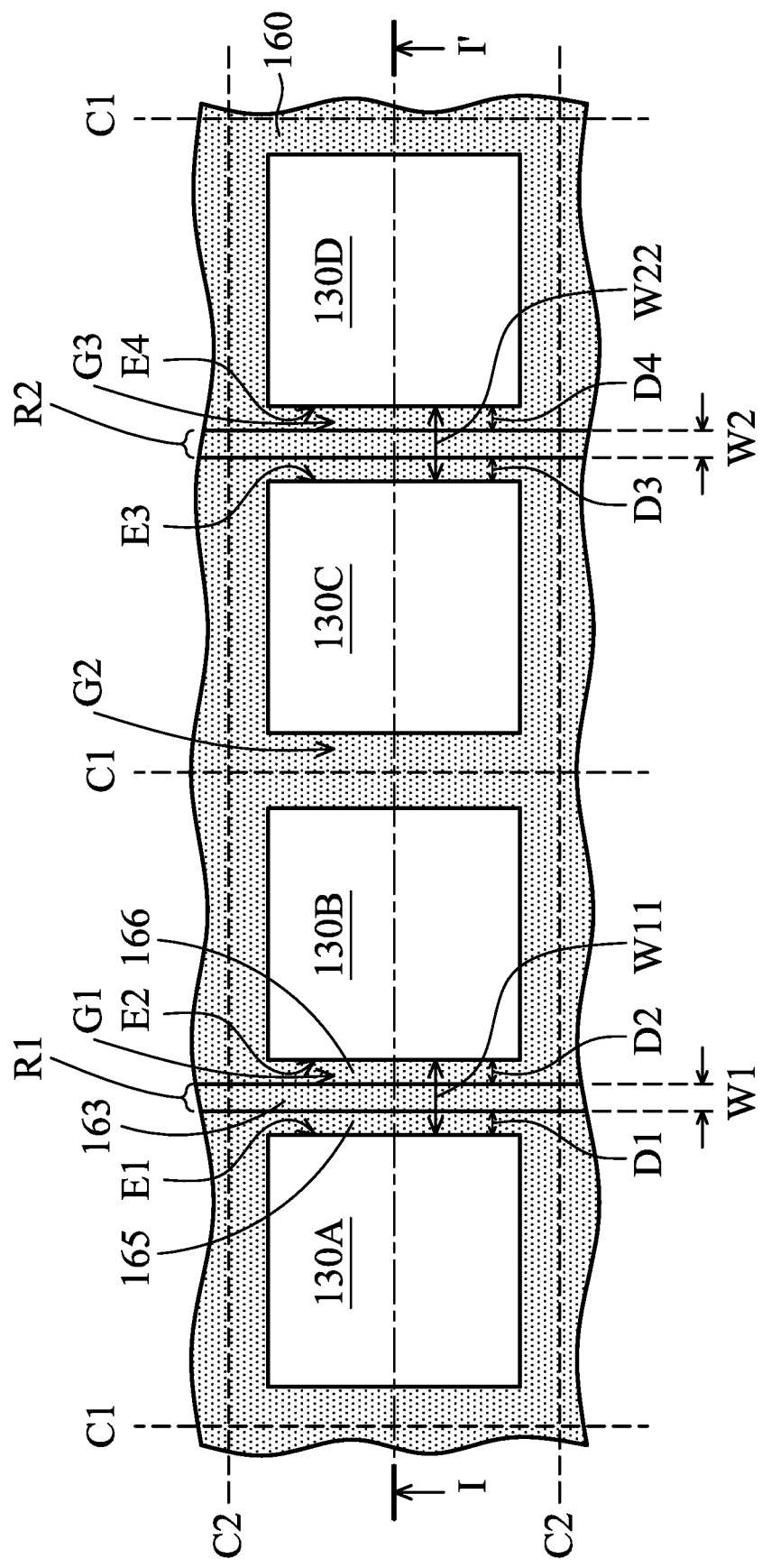

FIG. 1E-1 is a top view of the chip package structure of FIG. 1E, in accordance with some embodiments. FIG. 1E is a cross-sectional view illustrating the chip package structure along a sectional line I-I' in FIG. 1E-1, in accordance with some embodiments.

As shown in FIGS. 1E and 1E-1, trenches R1 and R2 are formed in the molding layer 160, in accordance with some embodiments. The trenches R1 and R2 are formed using a laser cutting process or another suitable process. The trench R1 is formed in the gap G1 between the chips 130A and 130B, in accordance with some embodiments. The trench R1 is narrower than the gap G1, in accordance with some embodiments. The trench R1 does not pass through the molding layer 160, in accordance with some embodiments. In some embodiments, a portion 163 of the molding layer 160 is between the trench R1 and the redistribution structure 120.

The trenches R1 and R2 do not pass through the molding layer 160 and therefore do not expose the redistribution structure 120, in accordance with some embodiments. Therefore, the molding layer 160 is able to protect the redistribution structure 120 thereunder from damage and contamination.

The trench R1 is spaced apart from the chips 130A and 130B, in accordance with some embodiments. As shown in FIG. 1E-1, the trench R1 extends along edges E1 and E2 of the chips 130A and 130B (or the substrates 132), in accordance with some embodiments. The trench R1 is substantially parallel to the edges E1 and E2, in accordance with some embodiments. That is, a distance D1 between the trench R1 and the edge E1 is maintained at a substantially constant value, and a distance D2 between the trench R1 and the edge E2 is maintained at a substantially constant value, in accordance with some embodiments.

In some embodiments, the distance D1 is substantially equal to the distance D2. In some other embodiments, the distance D1 is not equal to the distance D2. In some embodiments (not shown), the trench R1 is not parallel to the edge E1 or E2, in accordance with some embodiments.

The trench R2 is formed in the gap G3 between the chips 130C and 130D, in accordance with some embodiments. The trench R2 is narrower than the gap G3, in accordance with some embodiments. The trench R2 does not pass through the molding layer 160, in accordance with some embodiments. In some embodiments, a portion 164 of the molding layer 160 is between the trench R2 and the redistribution structure 120.

The trench R2 is spaced apart from the chips 130C and 130D, in accordance with some embodiments. The trench R2 extends along edges E3 and E4 of the chips 130C and 130D (or the substrates 132), in accordance with some embodiments. The trench R2 is substantially parallel to the edges E3 and E4, in accordance with some embodiments. That is, a distance D3 between the trench R2 and the edge E3 is maintained at a substantially constant value, and a distance D4 between the trench R2 and the edge E4 is maintained at a substantially constant value, in accordance with some embodiments.

In some embodiments, the distance D3 is substantially equal to the distance D4. In some other embodiments, the distance D3 is not equal to the distance D4. In some embodiments, the distance D1 is substantially equal to the distance D3, and the distance D2 is substantially equal to the distance D4. In some other embodiments, the distance D1 is not equal to the distance D3 and/or the distance D2 is not equal to the distance D4. In some embodiments (not shown), the trench R2 is not parallel to the edge E3 or E4, in accordance with some embodiments.

As shown in FIGS. 1E and 1E-1, predetermined cutting lines C1 and C2 surround the chips 130A, 130B, 130C, and 130D and portions of the trenches R1 and R2, in accordance with some embodiments. The predetermined cutting lines C1 and C2 are represented by dotted lines, in accordance with some embodiments. The trenches R1 and R2 do not completely overlap with the predetermined cutting lines C1 and C2, in accordance with some embodiments. The trenches R1 and R2 do not coincide with the predetermined cutting lines C1 and C2, in accordance with some embodiments. The trenches R1 and R2 are perpendicular to the predetermined cutting lines C2, in accordance with some embodiments. The trenches R1 and R2 are spaced apart from the predetermined cutting lines C1, in accordance with some embodiments.

Figures 1, 1E, 2:
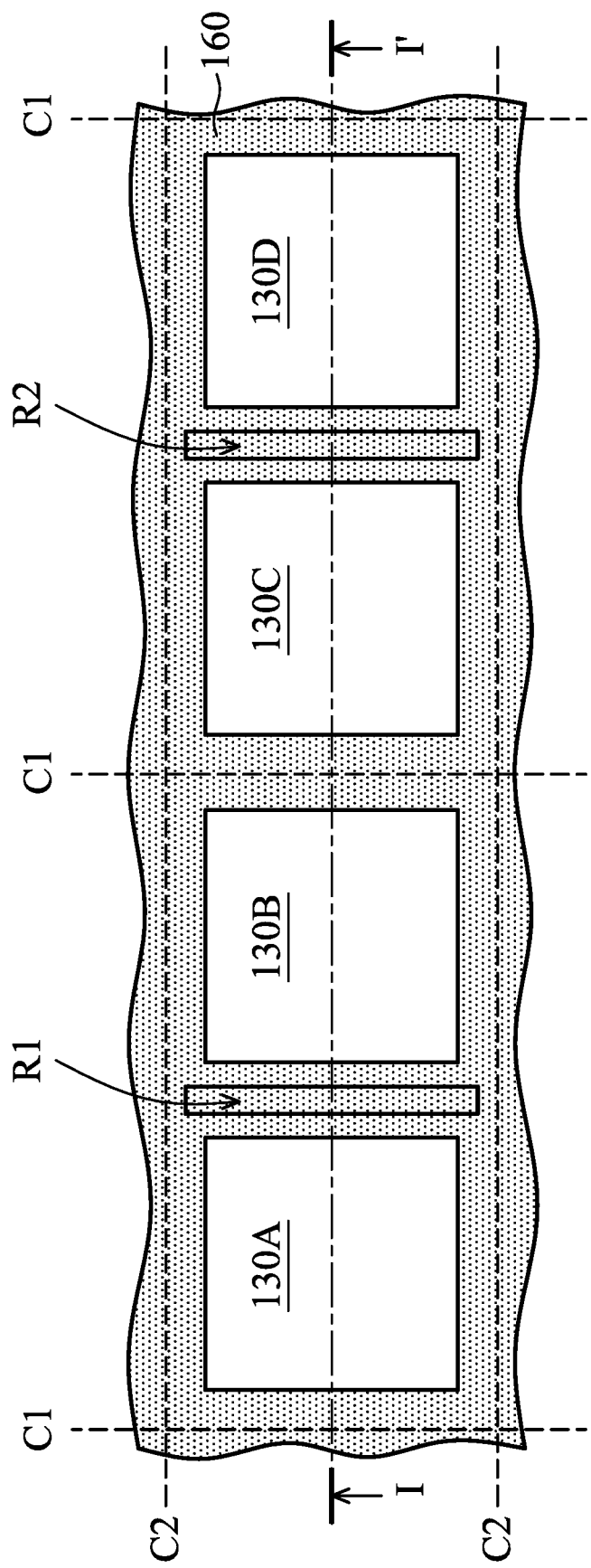

The predetermined cutting lines C2 extend across the trenches R1 and R2, in accordance with some embodiments. The trenches R1 and R2 extend across the predetermined cutting lines C2, in accordance with some embodiments. In some other embodiments, as shown in FIG. 1E-2, the predetermined cutting lines C2 do not overlap with the trenches R1 and R2, in accordance with some embodiments. That is, the trenches R1 and R2 are spaced apart from the predetermined cutting lines C2, in accordance with some embodiments.

As shown in FIG. 1E-1, the trenches R1 and R2 have a continuous line shape, in accordance with some embodiments. In some other embodiments, as shown in FIG. 1E-3, the trenches R1 and R2 have a dotted line shape, in accordance with some embodiments. That is, the trench R1 has portions P1, in accordance with some embodiments.

The portions P1 are spaced apart from each other and are arranged along a first line, in accordance with some embodiments. In some embodiments, the portions P1 have a same depth. In some other embodiments, the portions P1 have different depths. The trench R2 has portions P2, in accordance with some embodiments. The portions P2 are spaced apart from each other and are arranged along a second line, in accordance with some embodiments. In some embodiments, the portions P2 have a same depth. In some other embodiments, the portions P2 have different depths.

As shown in FIGS. 1E and 1E-1, the trench R1 is between the chip 130A and the (central) predetermined cutting line C1, in accordance with some embodiments. The trench R2 is between the chip 130D and the (central) predetermined cutting line C1, in accordance with some embodiments.

As shown in FIGS. 1E and 1E-1, the molding layer 160 has portions 165 and 166, in accordance with some embodiments. The portion 163 of the molding layer 160 is between the portions 165 and 166, in accordance with some embodiments. The portions 163, 165, and 166 are located on a same side 132c of the chip 130A (or the substrate 132), in accordance with some embodiments. The portions 163, 165, and 166 are between the chips 130A and 130B, in accordance with some embodiments.

The portions 163, 165, and 166 have top surfaces 163a, 165a, and 166a, in accordance with some embodiments. The top surfaces 165a and 166a are substantially coplanar with the top surfaces 132b of the substrates 132 of the chips 130A and 130B, in accordance with some embodiments. In some embodiments, a distance D5 between the top surface 163a and the redistribution structure 120 is less than a distance D6 between the top surface 165a or 166a and the redistribution structure 120. The distance D5 (i.e. the thickness of the portion 163) may be controlled by adjusting the laser power or the process time of the laser cutting process, which is used to form the trenches R1 and R2.

As shown in FIGS. 1E and 1E-1, the trench R1 has a depth DE1 and a width W1, in accordance with some embodiments. The trench R2 has a depth DE2 and a width W2, in accordance with some embodiments. The trenches R1 and R2 may function as buffer trenches that buffer (or partially isolate) thermal expansion in local areas of the molding layer 160.

For example, the thermal expansion of the molding layer 160 adjacent to the chip 130A is partially isolated from the thermal expansion of the molding layer 160 adjacent to the chip 130B. The thermal expansion of the molding layer 160 adjacent to the chip 130C is partially isolated from the thermal expansion of the molding layer 160 adjacent to the chip 130D.

The trenches R1 and R2 provide a space for accommodating the thermal expansion of the molding layer 160, in accordance with some embodiments. Therefore, the warpage of the molding layer 160 is reduced by the trenches R1 and R2, in accordance with some embodiments. As a result, the formation of the trenches R1 and R2 improves the yield of the chip package structure with the molding layer 160.

In some embodiments, an aspect ratio (DE1/W1) of the trench R1 ranges from about 4 to about 70. In some embodiments, an aspect ratio (DE2/W2) of the trench R2 ranges from about 4 to about 70. If the aspect ratio (DE1/W1 or DE2/W2) of the trench R1 or R2 is greater than 70, a heat dissipation layer formed subsequently may be unable to be filled into the trench R1 or R2.

In some embodiments, a ratio of the depth DE1 or DE2 to a distance D7 between the top surface 162 of the molding layer 160 and the redistribution structure 120 ranges from about 0.1 to about 0.9. If the ratio of the depth DE1 or DE2 to the distance D7 is less than 0.1, the trench R1 or R2 is too shallow to reduce the warpage of the molding layer 160. If the ratio of the depth DE1 or DE2 to the distance D7 is greater than 0.9, the trench R1 or R2 may easily pass through the molding layer 160 and expose the redistribution structure 120, and the exposed redistribution structure 120 may be damaged or contaminated.

In some embodiments, the ratio of the depth DE1 or DE2 to the distance D7 ranges from about 0.5 to about 0.9. The width W1 or W2 ranges from about 10 μm to about 100 μm, in accordance with some embodiments. In some embodiments, the ratio of the width W1 of the trench R1 to the width W11 of the gap G1 ranges from about 0.05 to about 0.5. In some embodiments, the ratio of the width W2 of the trench R2 to the width W22 of the gap G3 ranges from about 0.05 to about 0.5.

Figures 1, 1E, 2, 3:
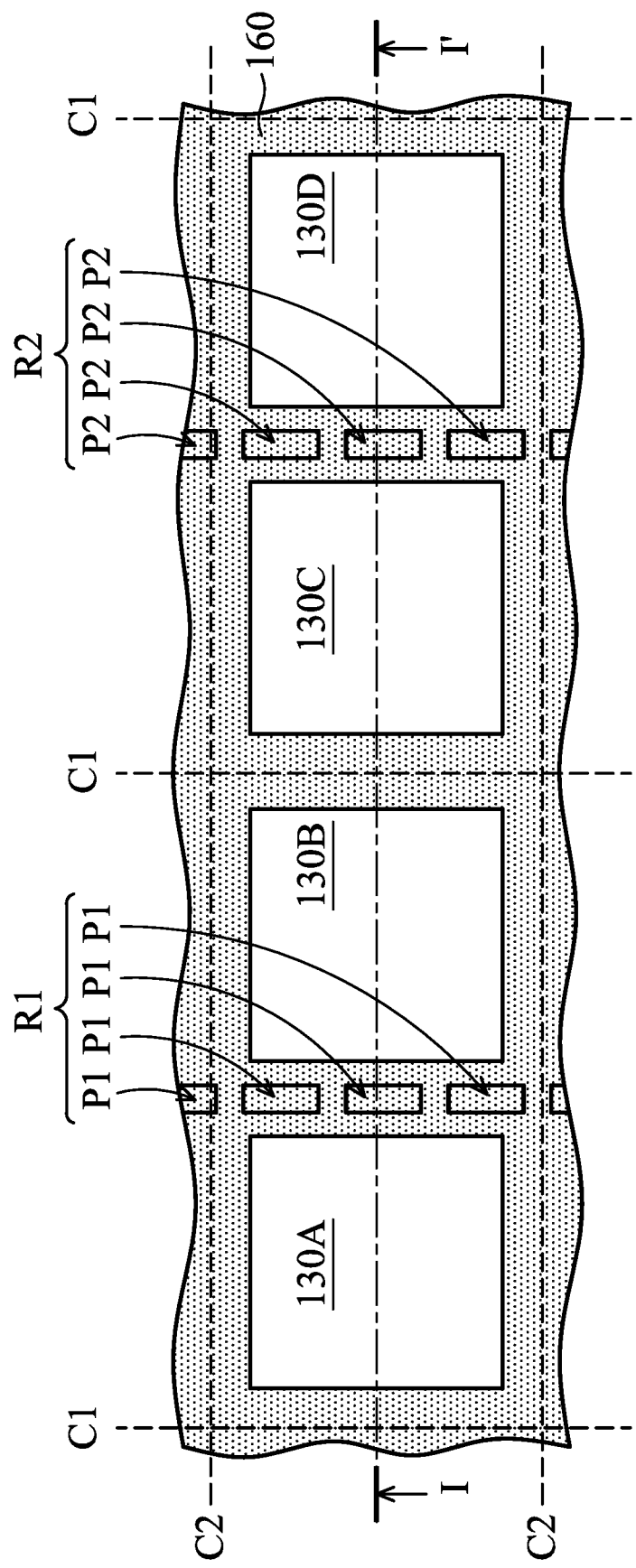
Figure 1F:
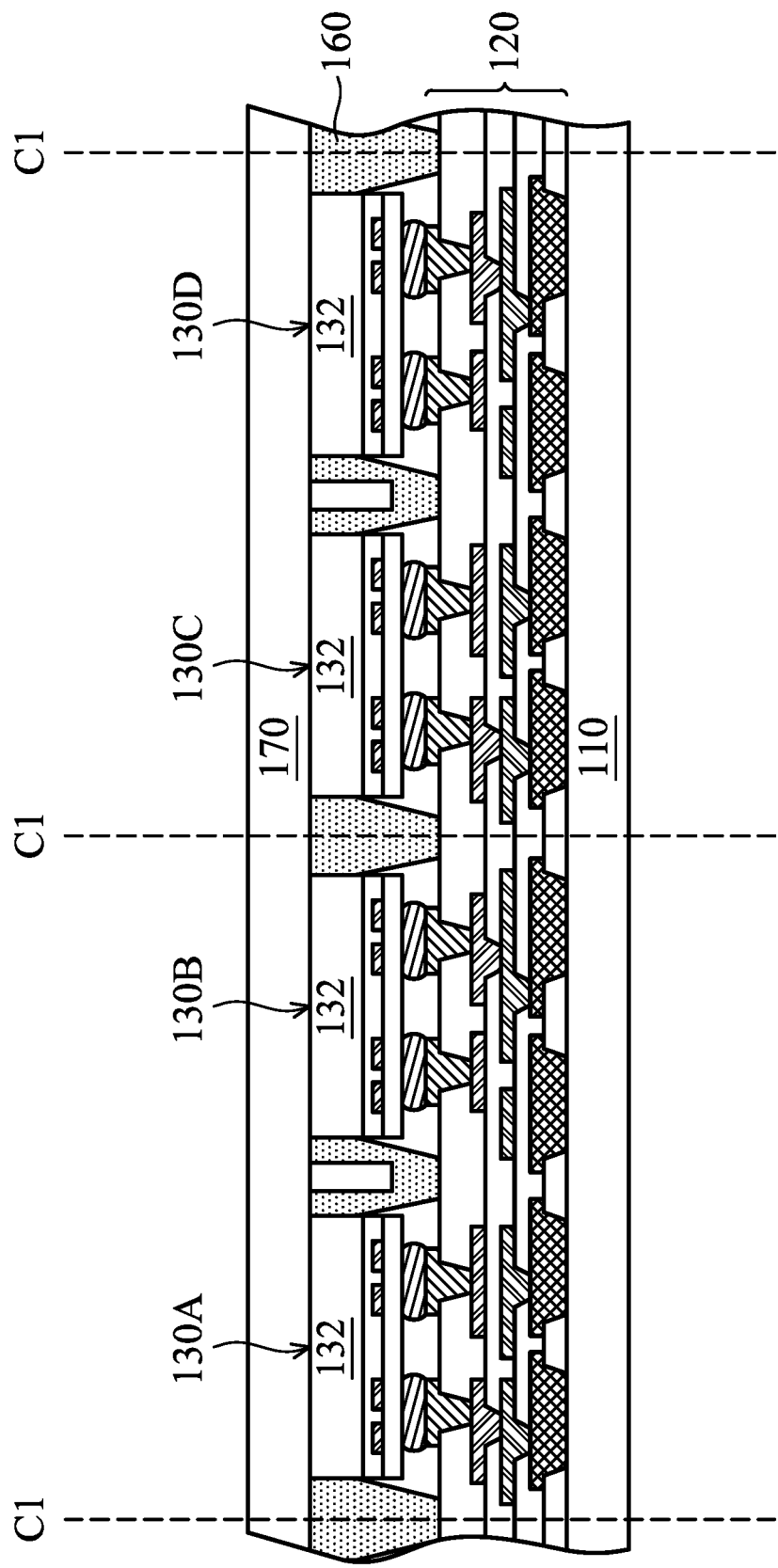
Figure 1G:
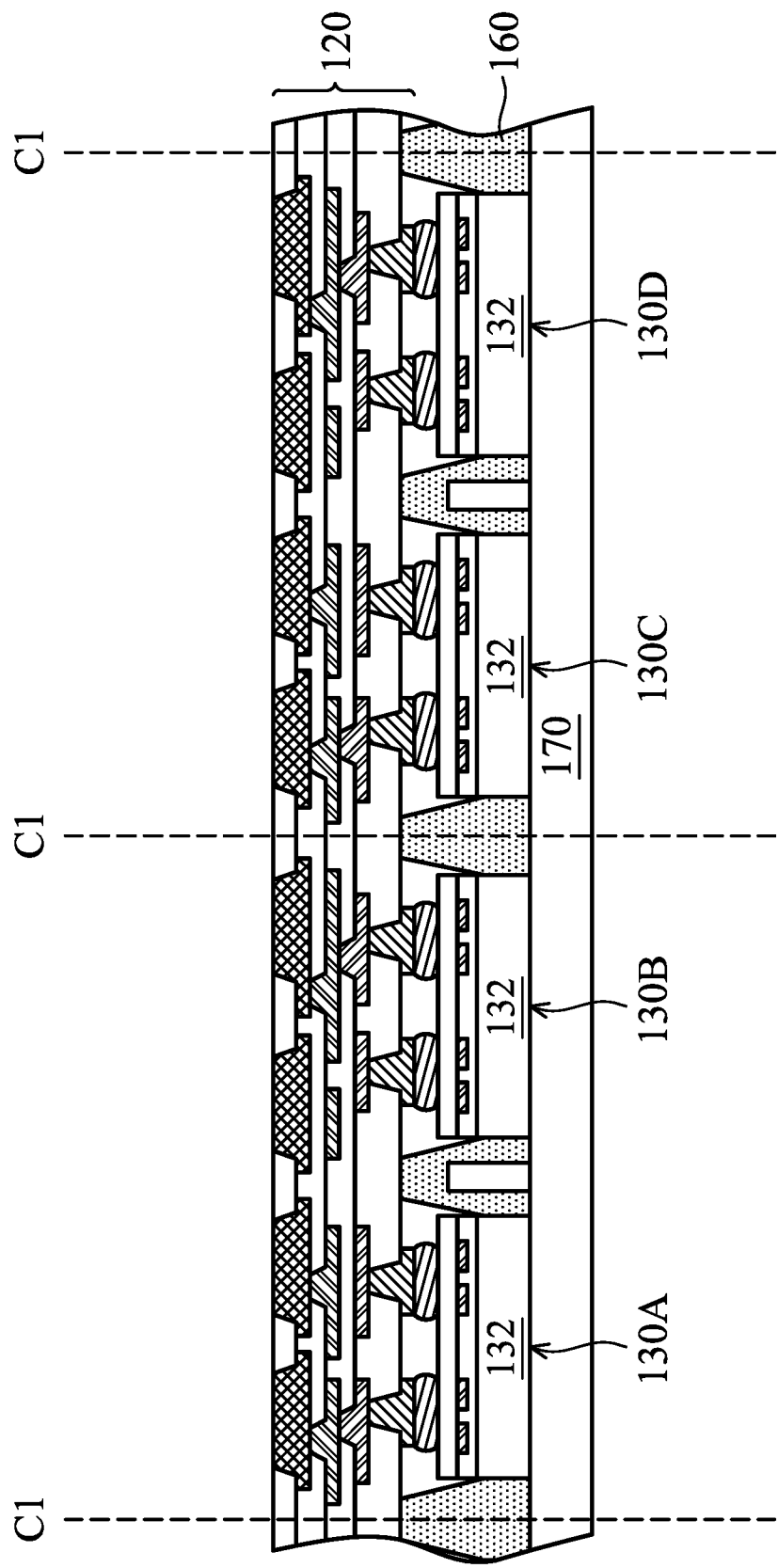

As shown in FIG. 1F, a tape layer 170 is bonded to the chips 130A, 130B, 130C, and 130D and molding layer 160, in accordance with some embodiments. The tape layer 170 is made of a polymer material or another suitable material, in accordance with some embodiments. As shown in FIG. 1G, the redistribution structure 120 is flipped upside down, in accordance with some embodiments. Thereafter, as shown in FIG. 1G, the carrier substrate 110 is removed, in accordance with some embodiments.

Figure 1H:
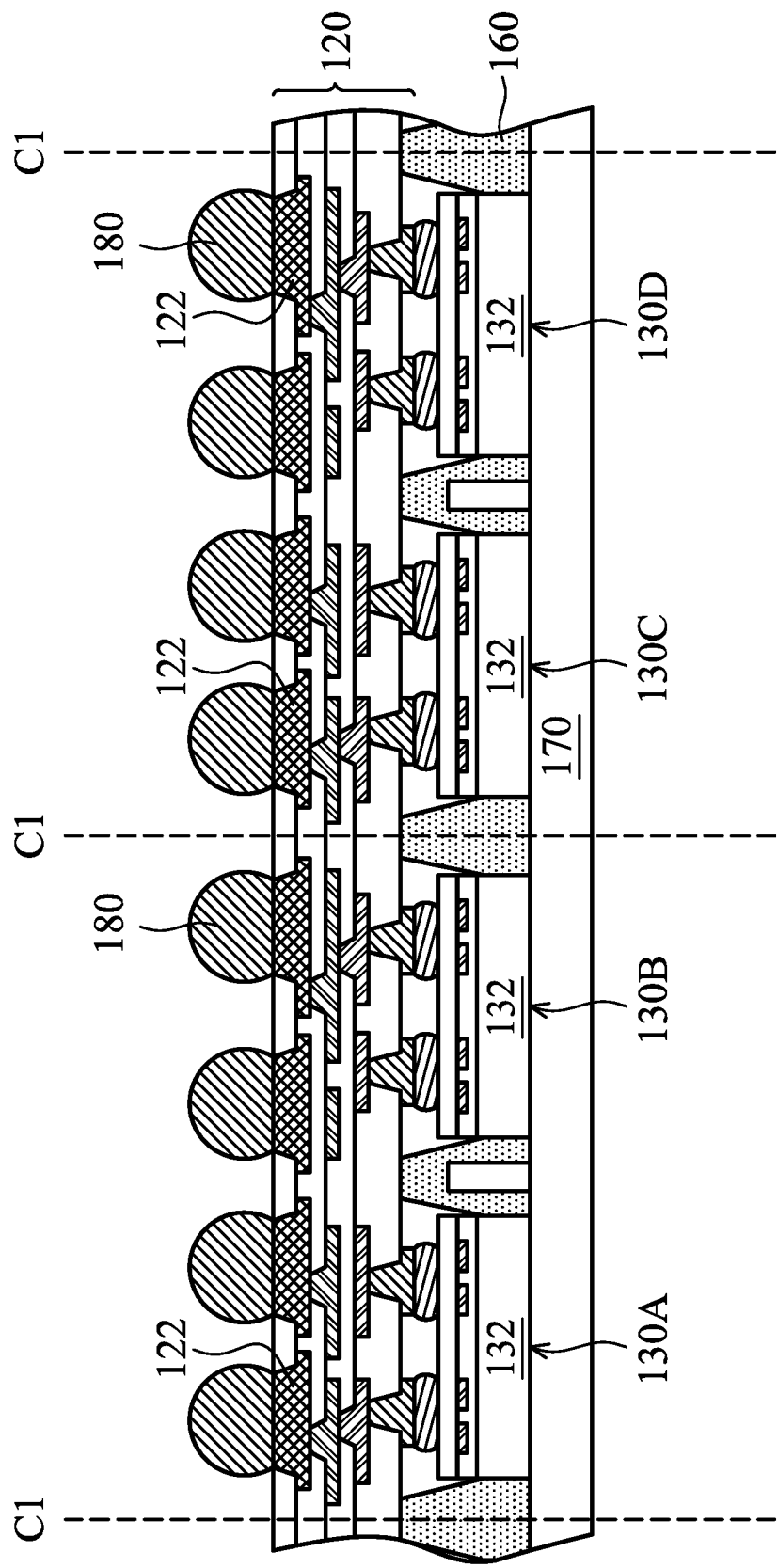

As shown in FIG. 1H, conductive bumps 180 are respectively formed over the conductive pads 122, in accordance with some embodiments. The conductive bumps 180 are made of a solder material, such as Sn and Ag or another suitable conductive material, in accordance with some embodiments.

Figure 1I:
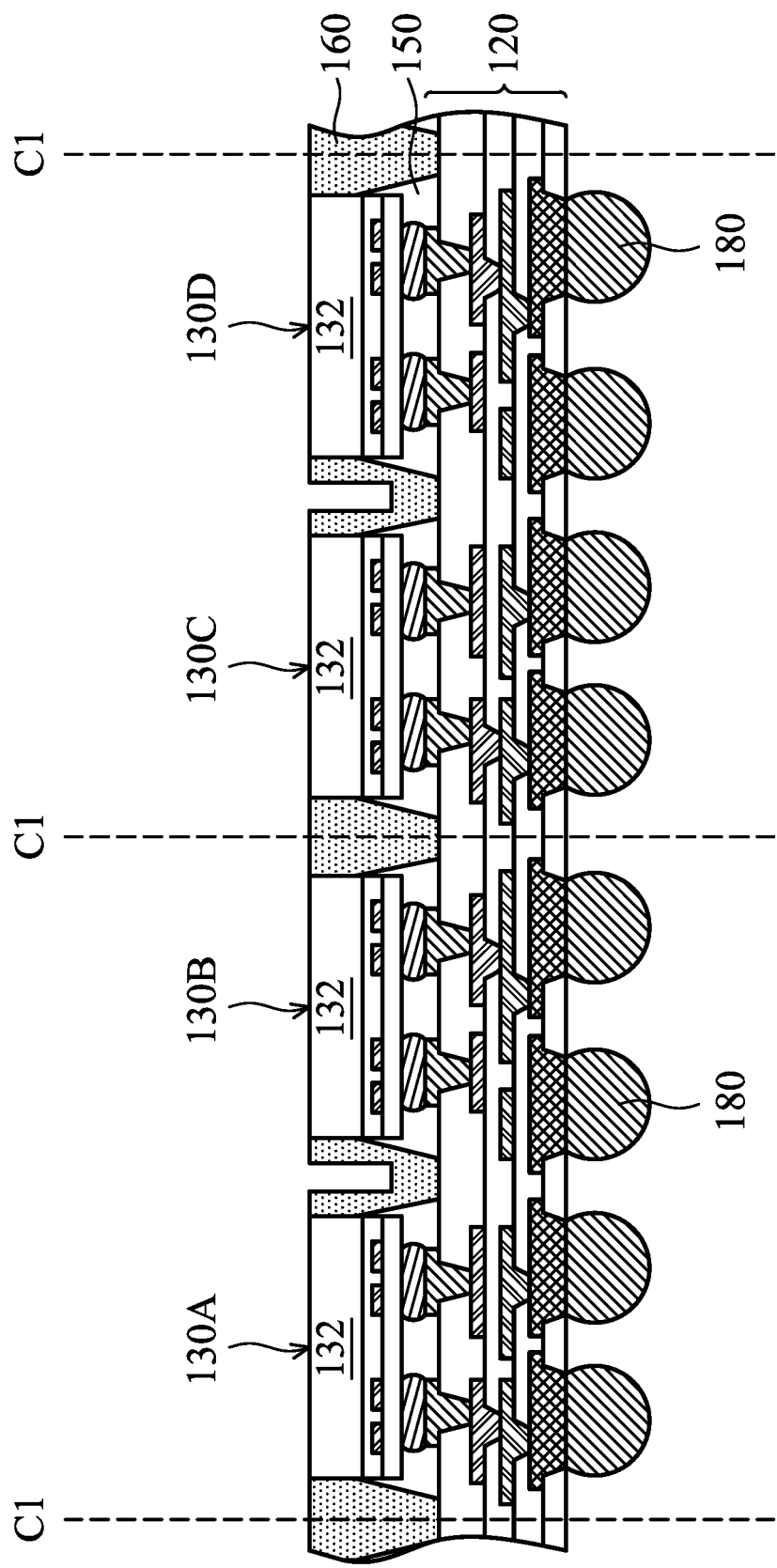
Figure 1J:
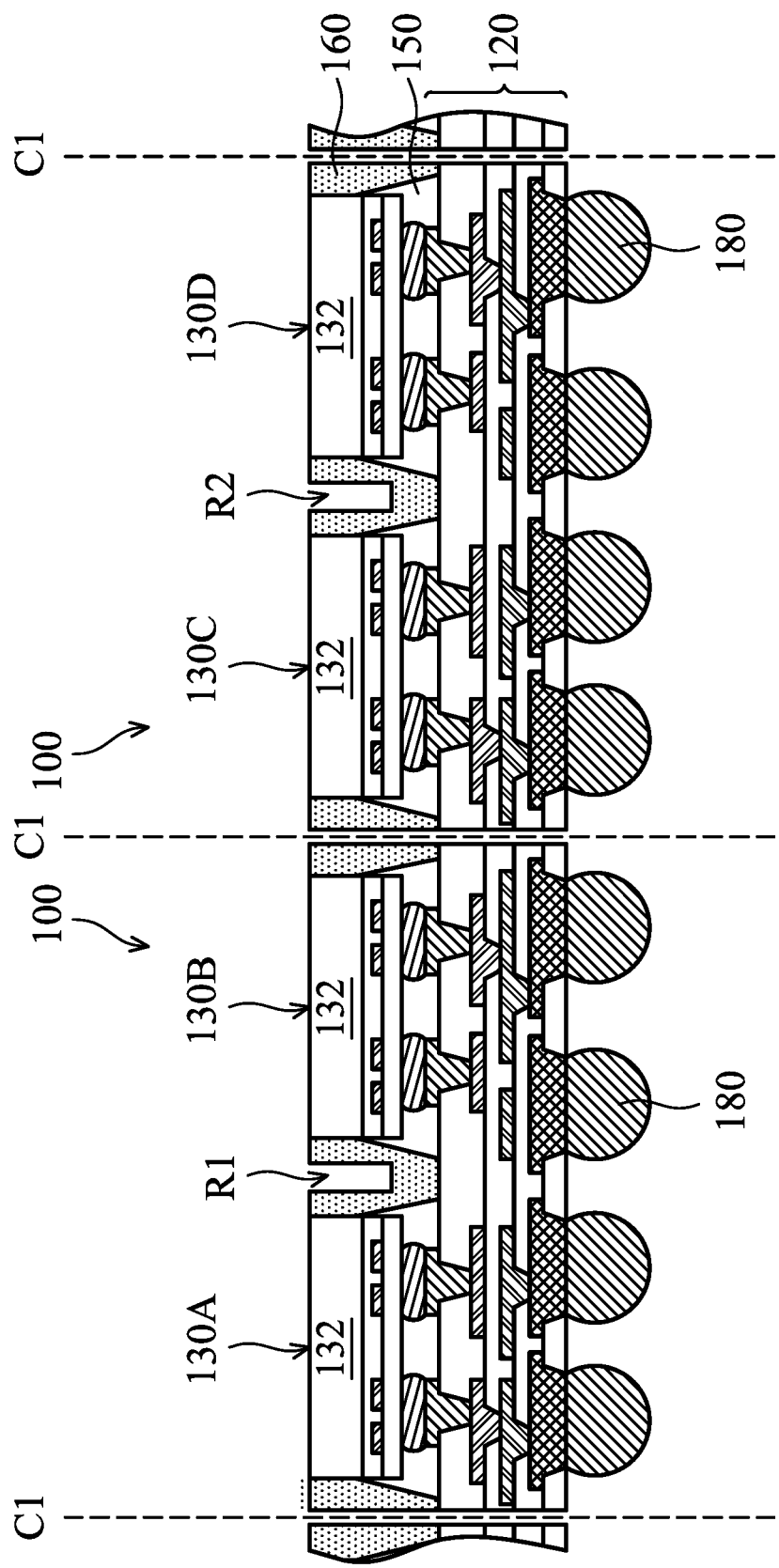

As shown in FIG. 1I, the redistribution structure 120 is flipped upside down, in accordance with some embodiments. As shown in FIG. 1I, the tape layer 170 is removed, in accordance with some embodiments. As shown in FIGS. 1J and 1E-1, the molding layer 160 and the redistribution structure 120 are cut through along the predetermined cutting lines C1 and C2 to form chip packages 100, in accordance with some embodiments.

Figure 1K:
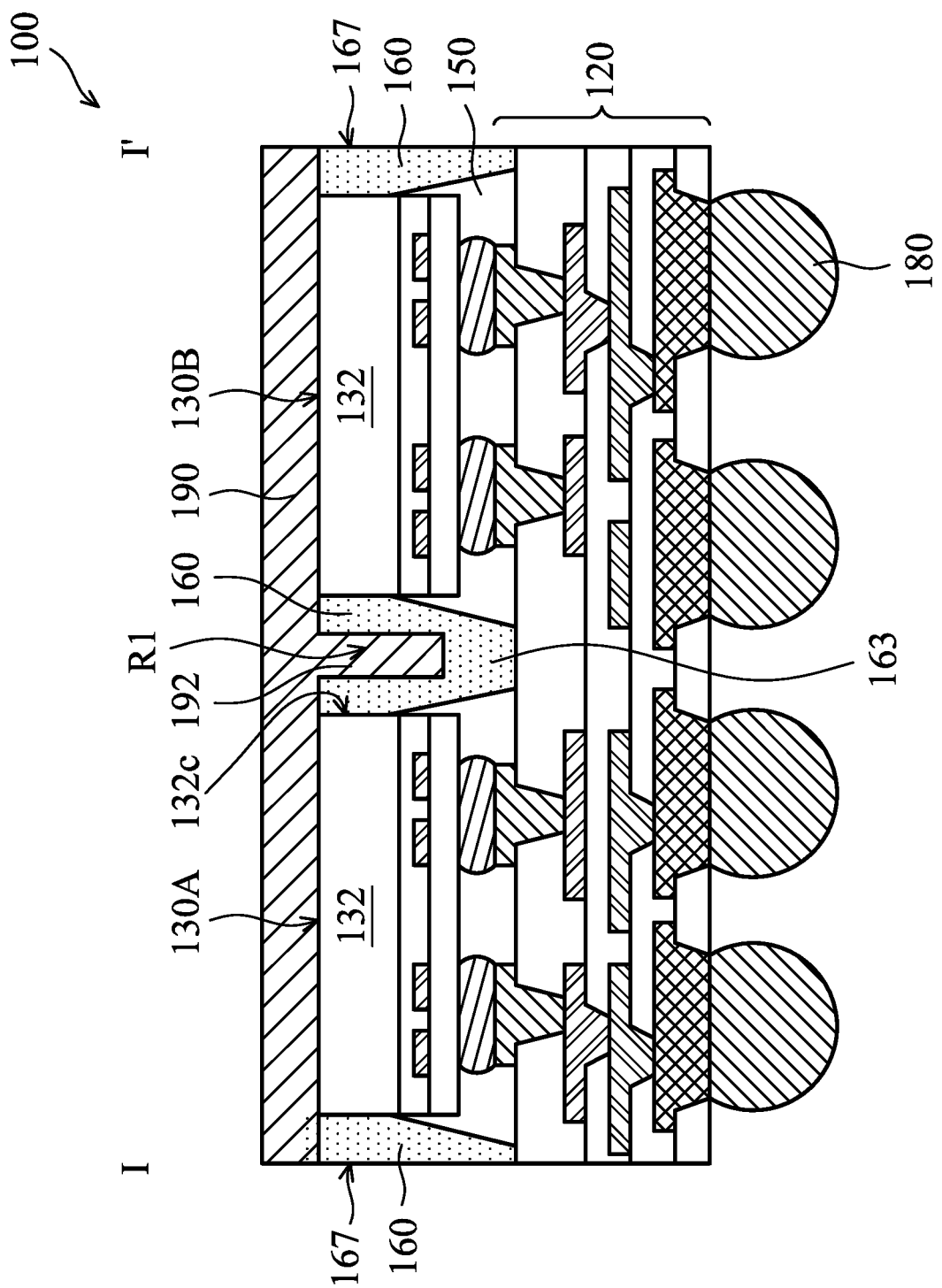
Figures 1, 1K:
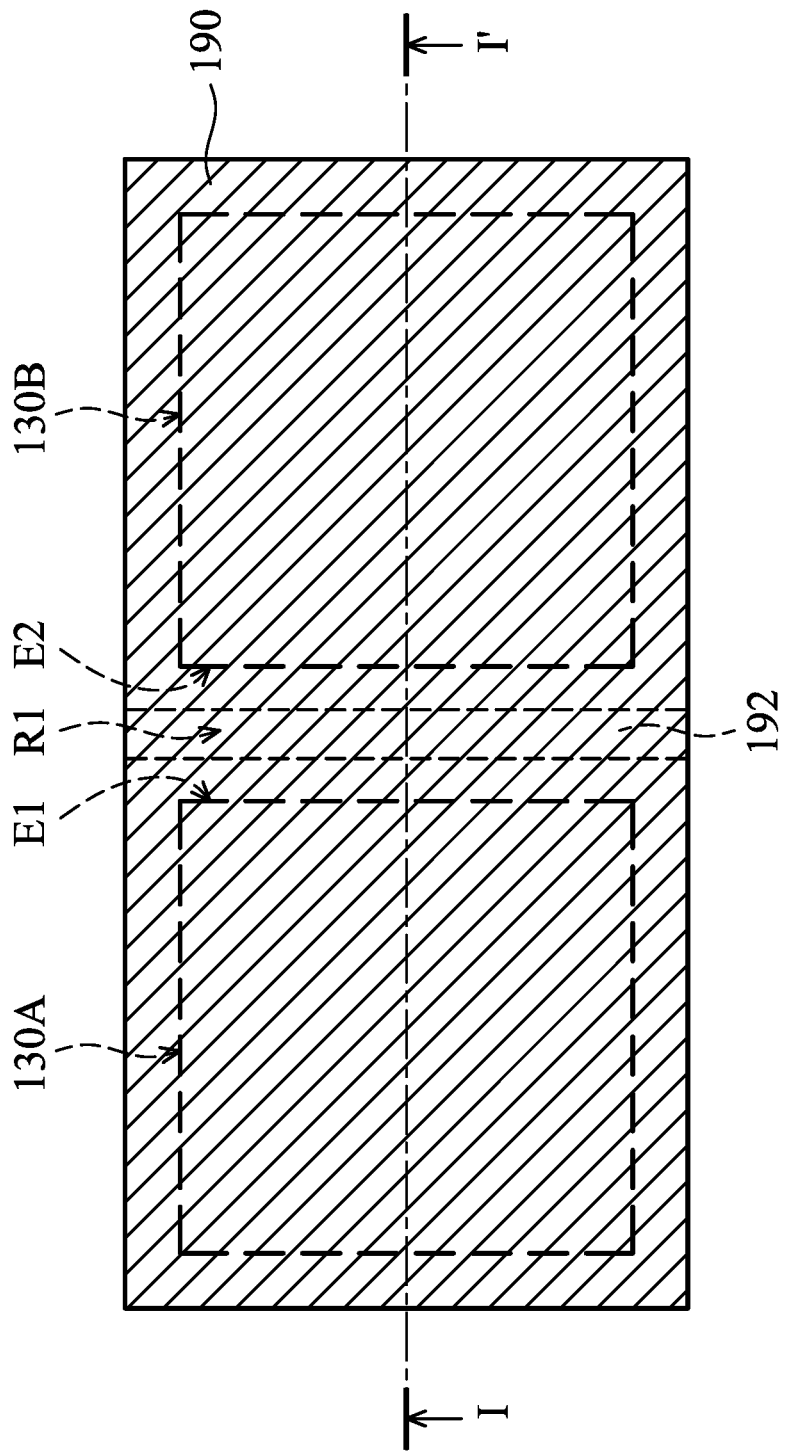

FIG. 1K-1 is a top view of the chip package structure 100 of FIG. 1K, in accordance with some embodiments. FIG. 1K is a cross-sectional view illustrating the chip package structure along a sectional line I-I' in FIG. 1K-1, in accordance with some embodiments. For the sake of simplicity, FIGS. 1K and 1K-1 only show one of the chip packages 100, in accordance with some embodiments.

As shown in FIGS. 1K and 1K-1, a heat dissipation layer 190 is formed over the chips 130A and 130B and the molding layer 160, in accordance with some embodiments. The heat dissipation layer 190 is in direct contact with the chips 130A and 130B and the molding layer 160, in accordance with some embodiments. The trench R1 is filled with a portion 192 of the heat dissipation layer 190, in accordance with some embodiments.

The heat dissipation layer 190 is configured for heat dissipation, in accordance with some embodiments. Heat generated from the chips 130A and 130B is dissipated by the heat dissipation layer 190 over the chips 130A and 130B and is further dissipated by the portion 192 between the chips 130A and 130B, in accordance with some embodiments. Therefore, the formation of the trench R1 may improve heat dissipation.

The portion 192 extends into the molding layer 160 and is over the portion 163 of the molding layer 160, in accordance with some embodiments. The portion 192 is spaced apart from the chips 130A and 130B and sidewalls 167 of the molding layer 160, in accordance with some embodiments. The portion 192 extends along the edges E1 and E2 of the chips 130A and 130B, in accordance with some embodiments. In some embodiments, a thermal conductivity coefficient of the heat dissipation layer 190 is greater than a thermal conductivity coefficient of the molding layer 160. The heat dissipation layer 190 is made of tin (Sn), silver (Ag), graphene, or another suitable heat dissipation material.

Figure 1L:
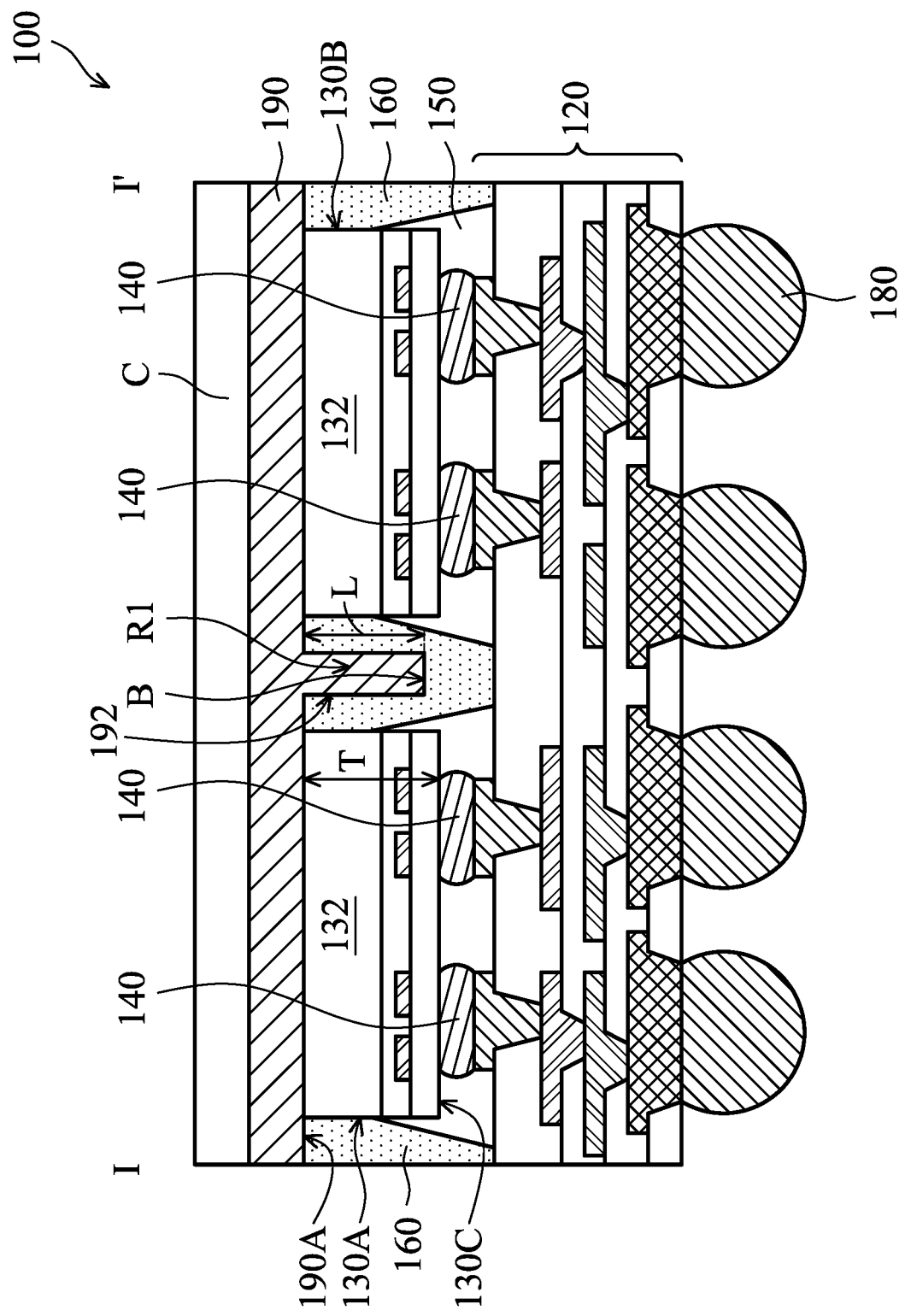
Figures 1, 1L:
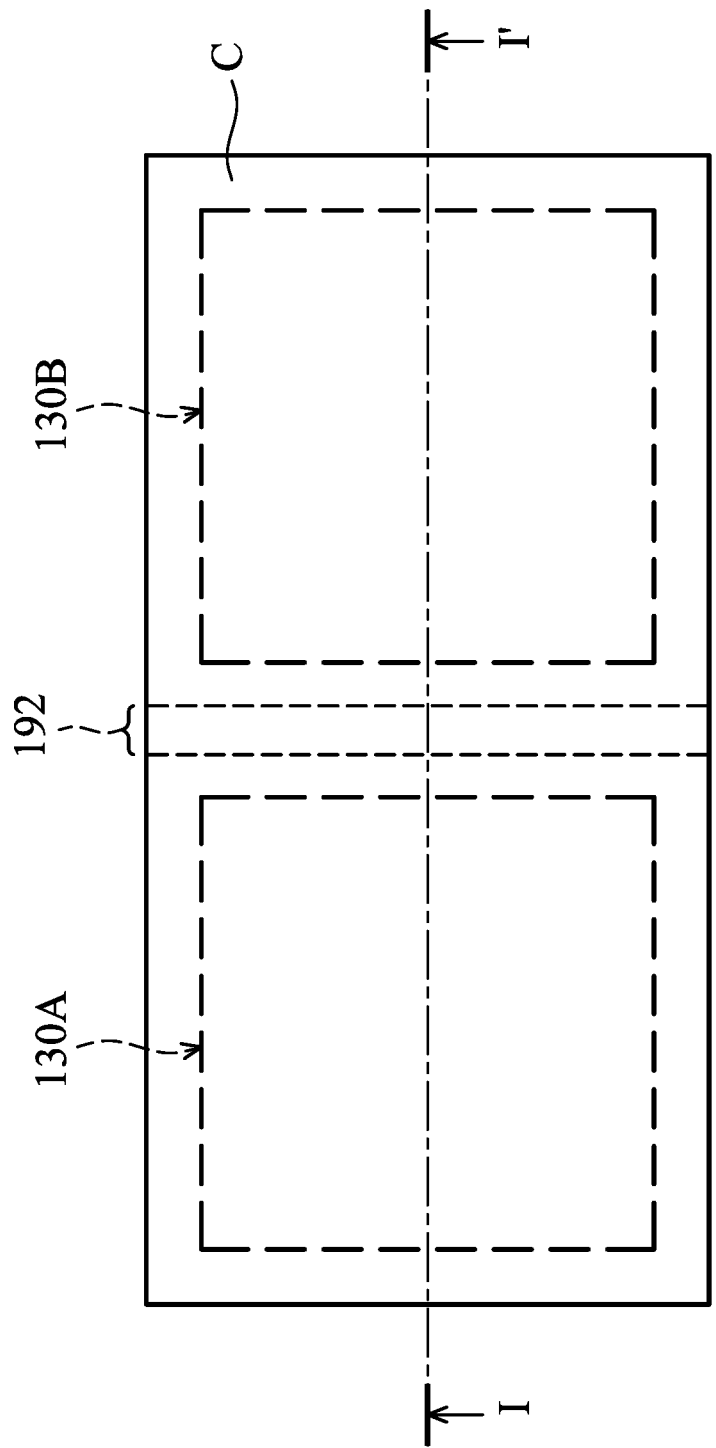
Figure 2:
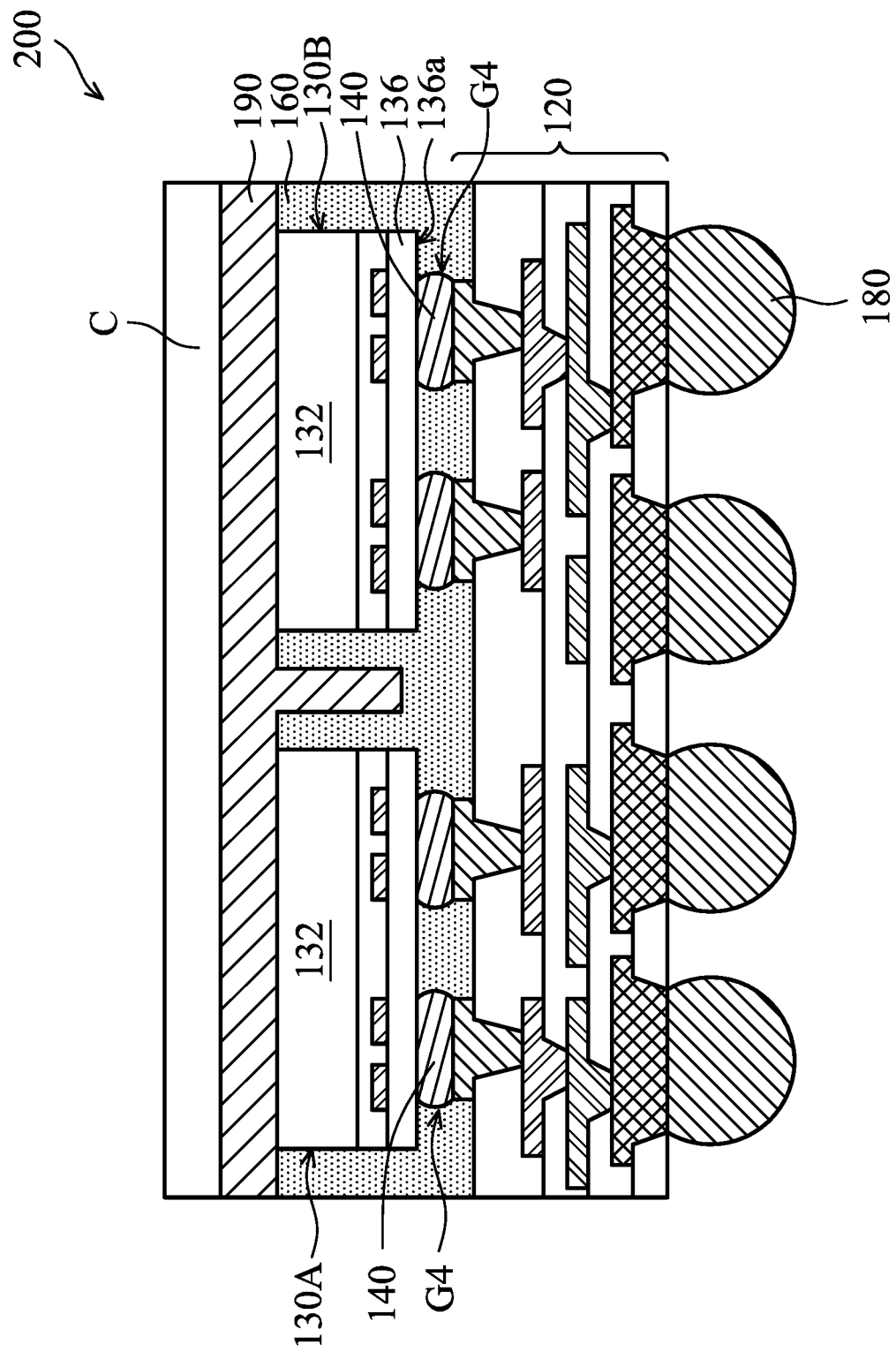
Figure 3:
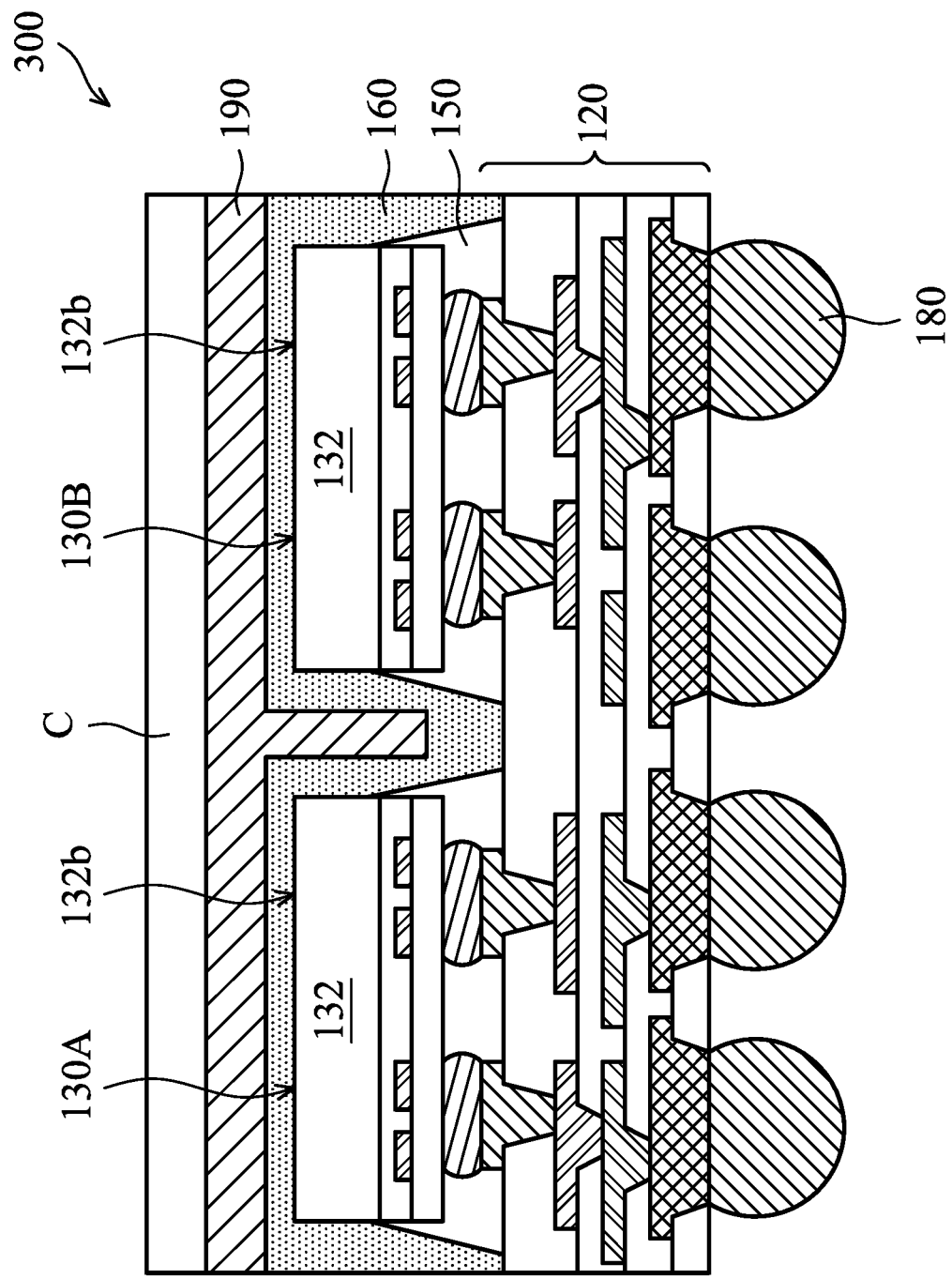

FIG. 1L-1 is a top view of the chip package structure 100 of FIG. 1L, in accordance with some embodiments. FIG. 1L is a cross-sectional view illustrating the chip package structure along a sectional line I-I' in FIG. 1L-1, in accordance with some embodiments.

As shown in FIGS. 1L and 1L-1, a cap layer C is formed over the heat dissipation layer 190, in accordance with some embodiments. The cap layer C is configured to protect the structures thereunder from damage and to improve heat dissipation efficiency, in accordance with some embodiments. The cap layer C is made of metal (e.g., copper, nickel, iron, gold, tin, or silver), ceramic or another suitable material.

As shown in FIG. 1L, the chip package structure 100 includes electronic devices (e.g., the chips 130A and 130B) on the redistribution structure 120, in accordance with some embodiments. The redistribution structure 120 is also referred to as a heterogeneous device module integrated (HDMI) structure, in accordance with some embodiments. In some embodiments, the portion 192 is formed from a first surface 190A of the heat dissipation layer 190, and the first surface 190A is in direct contact with the chips 130A and 130B. A bottom surface 130C of the chip 130A is in contact with the conductive bumps 140. Moreover, the length L of the portion 192 is less than the thickness T of the chip 130A.

In some embodiments (not shown), the chip package structure 100 is bonded to a substrate through the conductive bumps 180. If the trench R1 is not formed in the molding layer 160, the warpage of the molding layer 160 and the redistribution structure 120 may be large, which may hinder the bonding of the conductive bumps 180 to the substrate. Specifically, the conductive bumps 180 are over a curved surface of the warped redistribution structure 120. Therefore, after the bonding of the conductive bumps 180 to the substrate, a portion of the conductive bumps 180 are spaced apart from the substrate, and the issue is referred to as a cold joint issue. After the bonding of the conductive bumps 180 to the substrate, a portion of the adjacent conductive bumps 180 are squeezed and therefore are short circuited with each other, and the issue is referred to as a bump bridge issue. Since the trench R1 is formed in the molding layer 160 of the chip package structure 100, the warpage of the molding layer 160 and the redistribution structure 120 is reduced, and the cold joint issue and the bump bridge issue are prevented.

FIG. 2 is a cross-sectional view illustrating a chip package structure 200, in accordance with some embodiments. As shown in FIG. 2, the chip package structure 200 is similar to the chip package structure 100 of FIG. 1L, except that the chip package structure 200 does not have the underfill layer 150 of the chip package structure 100 of FIG. 1L, in accordance with some embodiments.

The molding layer 160 is filled into gaps G4 between the chips 130A and 130B and the redistribution structure 120, in accordance with some embodiments. The molding layer 160 surrounds the conductive bumps 140, in accordance with some embodiments. The molding layer 160 is in direct contact with the conductive bumps 140, the bottom surfaces 136a of the interconnect layer 136 of the chips 130A and 130B, and the redistribution structure 120, in accordance with some embodiments.

FIG. 3 is a cross-sectional view illustrating a chip package structure 300, in accordance with some embodiments. As shown in FIG. 3, the chip package structure 300 is similar to the chip package structure 100 of FIG. 1L, except that the molding layer 160 of the chip package structure 300 covers the top surfaces 132b of the substrates 132 of the chips 130A and 130B, in accordance with some embodiments. The molding layer 160 is partially between the heat dissipation layer 190 and the chips 130A and 130B, in accordance with some embodiments.

Figure 4:
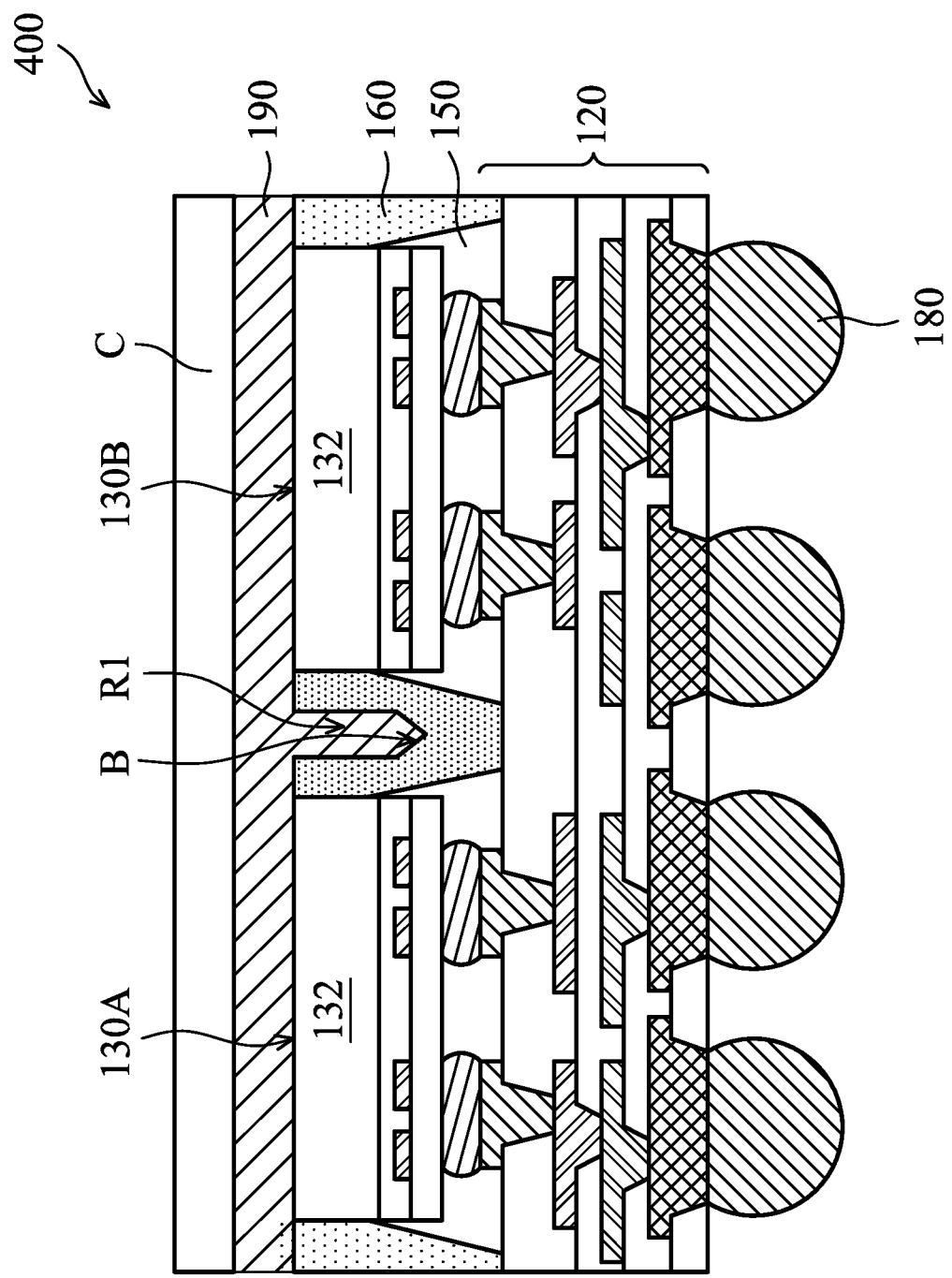
FIG. 4 is a cross-sectional view illustrating a chip package structure, in accordance with some embodiments.

FIG. 4 is a cross-sectional view illustrating a chip package structure 400, in accordance with some embodiments. As shown in FIG. 4, the chip package structure 400 is similar to the chip package structure 100 of FIG. 1L, except that the bottom surface B of the trench R1 of the molding layer 160 of the chip package structure 400 is a V-shaped bottom surface, in accordance with some embodiments. In contrast, the bottom surface B of the trench R1 of the molding layer 160 of the chip package structure 100 of FIG. 1L is a flat bottom surface, in accordance with some embodiments.

Figure 5:
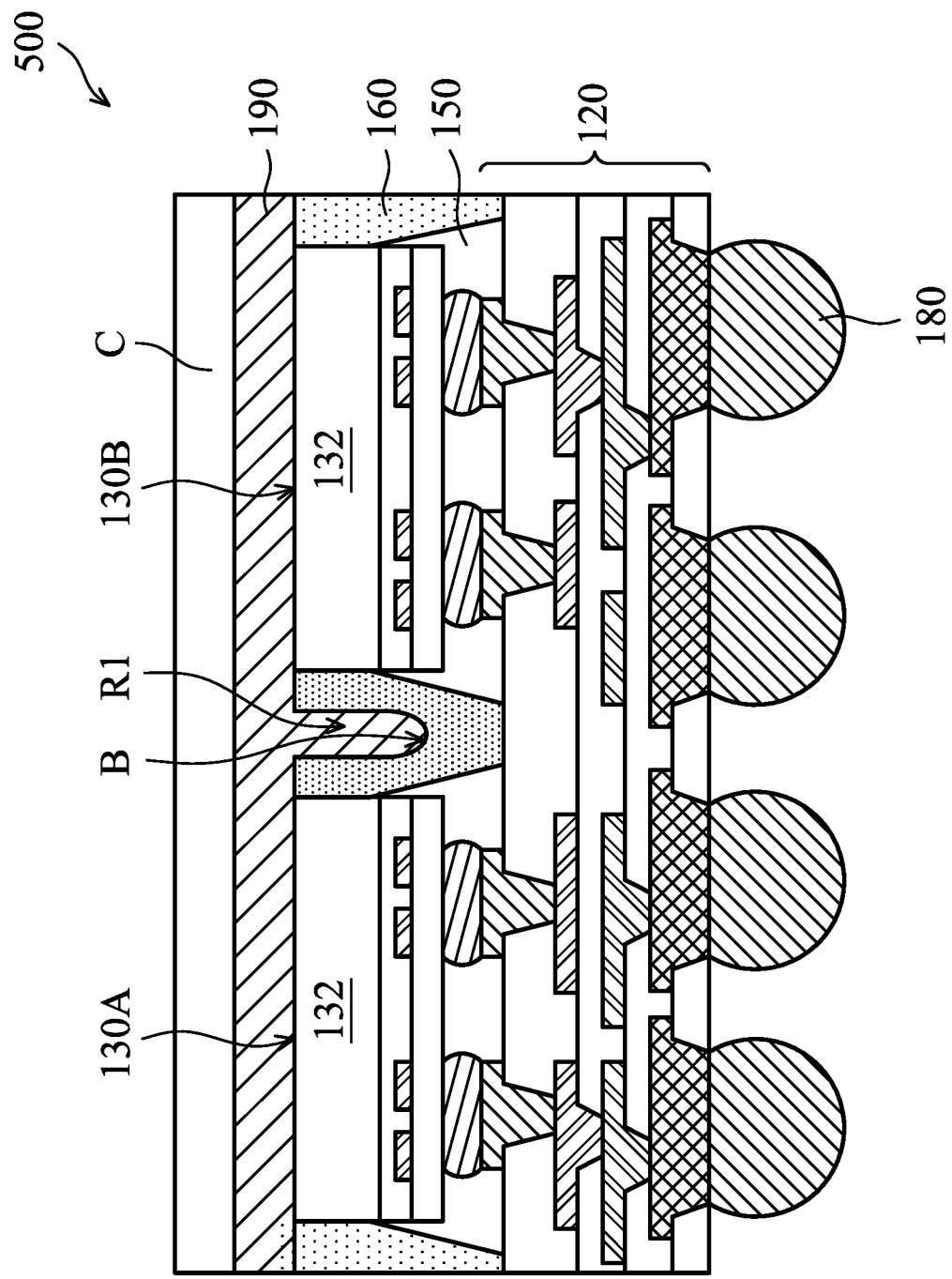
FIG. 5 is a cross-sectional view illustrating a chip package structure, in accordance with some embodiments.

FIG. 5 is a cross-sectional view illustrating a chip package structure 500, in accordance with some embodiments. As shown in FIG. 5, the chip package structure 500 is similar to the chip package structure 100 of FIG. 1L, except that the bottom surface B of the trench R1 of the molding layer 160 of the chip package structure 500 is a curved bottom surface, in accordance with some embodiments.

Figure 6:
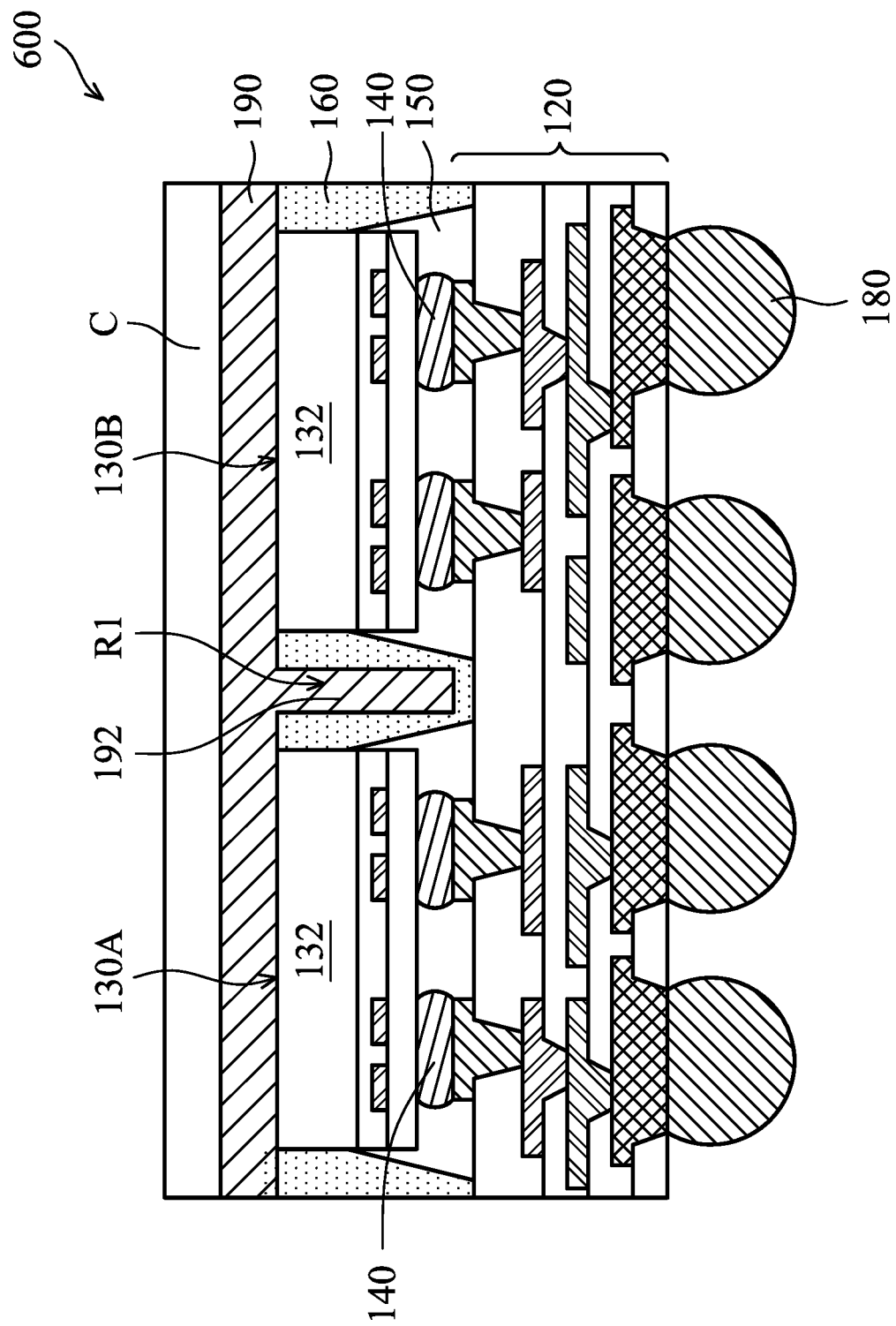
FIG. 6 is a cross-sectional view illustrating a chip package structure, in accordance with some embodiments.

FIG. 6 is a cross-sectional view illustrating a chip package structure 600, in accordance with some embodiments. As shown in FIG. 6, the chip package structure 600 is similar to the chip package structure 100 of FIG. 1L, except that the heat dissipation layer 190 of the chip package structure 600 extends more deeply into the molding layer 160 than the heat dissipation layer 190 of the chip package structure 100 of FIG. 1L, in accordance with some embodiments.

That is, the trench R1 of the molding layer 160 of the chip package structure 600 is deeper than that of the chip package structure 100, in accordance with some embodiments. The portion 192 of the heat dissipation layer 190 in the trench R1 is between the chips 130A and 130B and further between the conductive bumps 140, in accordance with some embodiments.

Figure 7A:
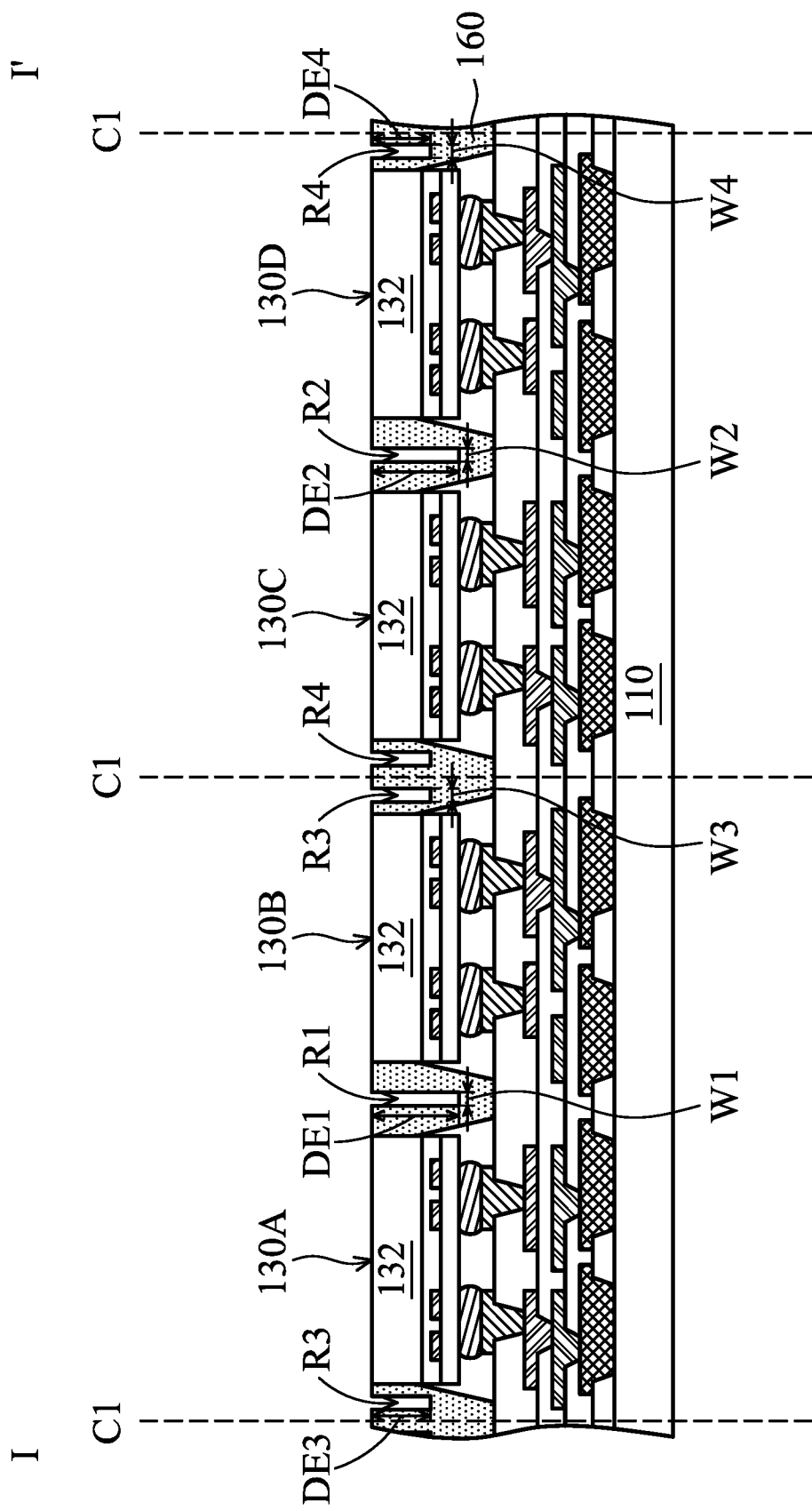
FIGS. 7A-7B are cross-sectional views of various stages of a process for forming a chip package structure, in accordance with some embodiments.
Figures 1, 7A:
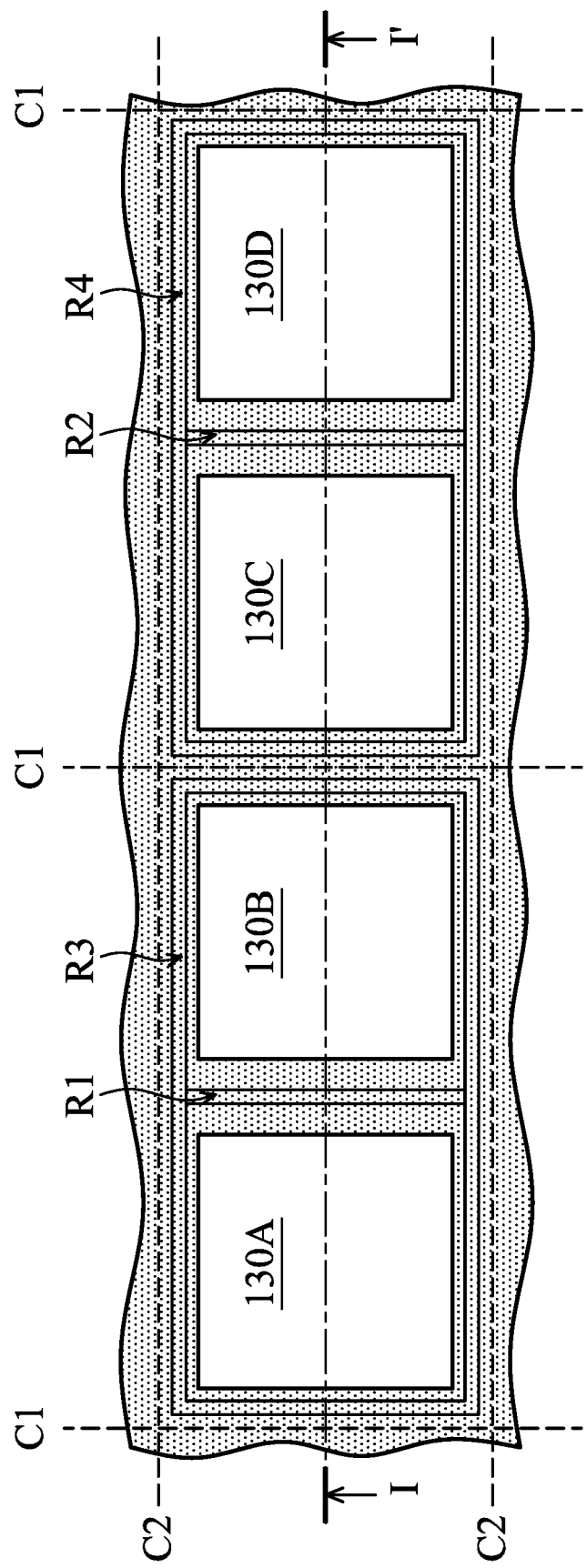
Figure 7B:
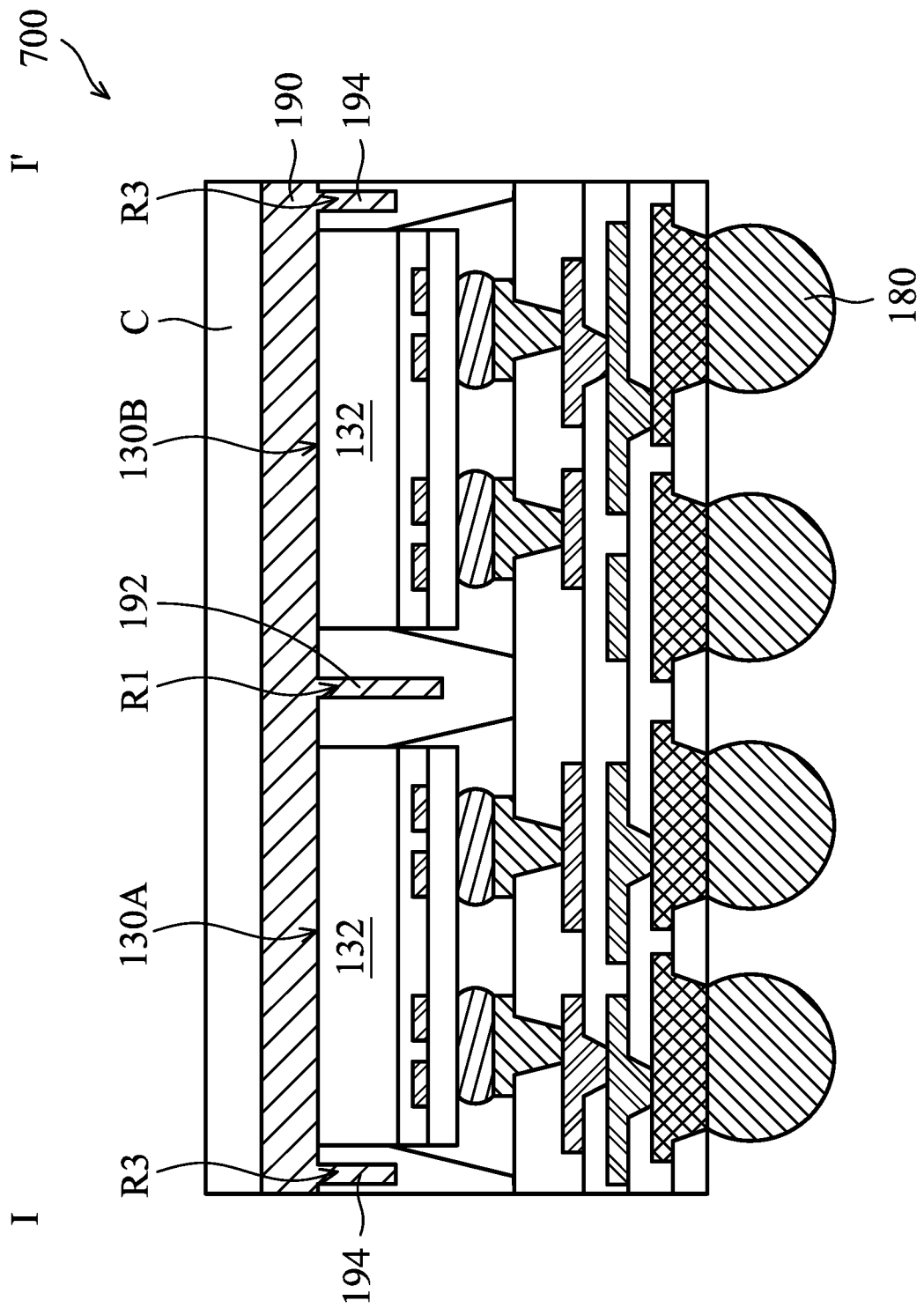
Figures 1, 7B:
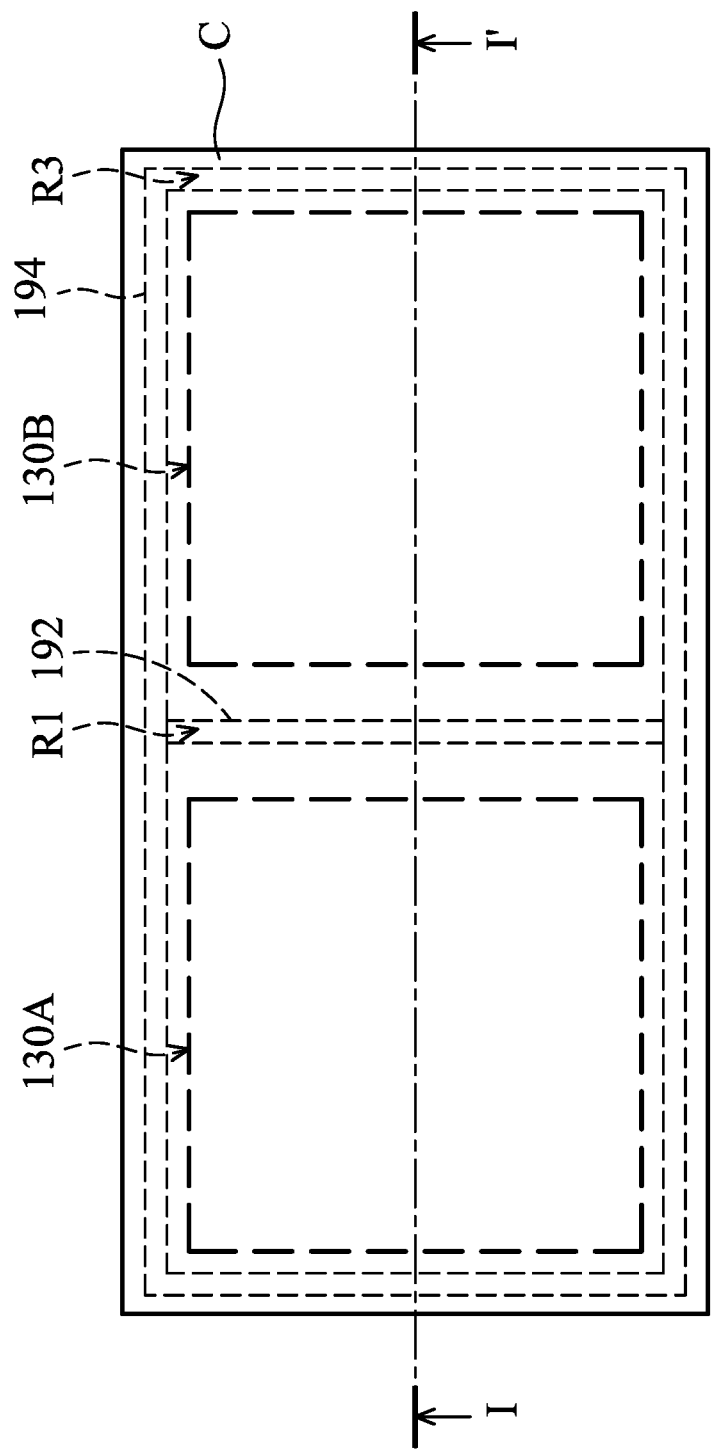

FIGS. 7A-7B are cross-sectional views of various stages of a process for forming a chip package structure, in accordance with some embodiments. FIGS. 7A-1 to 7B-1 are top views of the chip package structures of FIGS. 7A-7B, in accordance with some embodiments. FIGS. 7A-7B are cross-sectional views illustrating the chip package structures along a sectional line I-I' in FIGS. 7A-1 to 7B-1, in accordance with some embodiments.

After the step of FIG. 1D, as shown in FIGS. 7A and 7A-1, portions of the molding layer 160 are removed to form trenches R1, R2, R3 and R4 in the molding layer 160, in accordance with some embodiments. The trench R1 is between the chips 130A and 130B, in accordance with some embodiments. The trench R2 is between the chips 130C and 130D, in accordance with some embodiments.

The trench R3 surrounds the entire chips 130A and 130B, in accordance with some embodiments. The trench R3 is between the chip 130A or 130B and the predetermined cutting lines C1 and C2, in accordance with some embodiments. The trench R3 is spaced apart from the chips 130A and 130B and the predetermined cutting lines C1 and C2, in accordance with some embodiments. The trench R1 is connected to the trench R3, in accordance with some embodiments. In some embodiments, the depth DE1 of the trench R1 is different from the depth DE3 of the trench R3. The depth DE1 is greater than the depth DE3, in accordance with some embodiments.

Since the trench R3 is close to the predetermined cutting lines C1 and C2, the depth DE3 is less than the depth DE1 to maintain the structural strength of the molding layer 160 corresponding to the predetermined cutting lines C1 and C2 so as to maintain the yield of a subsequent cutting process, in accordance with some embodiments.

The trench R4 surrounds the entire chips 130C and 130D, in accordance with some embodiments. The trench R4 is between the chip 130C or 130D and the predetermined cutting lines C1 and C2, in accordance with some embodiments. The trench R4 is spaced apart from the chips 130C and 130D and the predetermined cutting lines C1 and C2, in accordance with some embodiments. The trench R2 is connected to the trench R4, in accordance with some embodiments. In some embodiments, the depth DE2 of the trench R2 is different from the depth DE4 of the trench R4. The depth DE2 is greater than the depth DE4, in accordance with some embodiments.

Since the trench R4 is close to the predetermined cutting lines C1 and C2, the depth DE4 is less than the depth DE2 to maintain the structural strength of the molding layer 160 corresponding to the predetermined cutting lines C1 and C2 so as to maintain the yield of a subsequent cutting process, in accordance with some embodiments.

In some other embodiments (not shown), the depths DE1, DE2, DE3, and DE4 are equal to each other. In some embodiments (not shown), the depth DE1 is less than the depth DE3, and the depth DE2 is less than the depth DE4. In some embodiments, the widths W1, W2, W3, and W4 are equal to each other. In some other embodiments (not shown), two of the widths W1, W2, W3, and W4 are different from each other. The trenches R1 and R2 are formed using one or more than one laser cutting process or another suitable process.

After performing the steps of FIGS. 1F-1L, as shown in FIGS. 7B and 7B-1, chip packages 700 are formed, in accordance with some embodiments. For the sake of simplicity, only one of the chip packages 700 is shown in FIGS. 7B and 7B-1, in accordance with some embodiments. The heat dissipation layer 190 has portions 192 and 194, in accordance with some embodiments.

The portion 192 is filled into the trench R1, in accordance with some embodiments. The portion 192 is between the chips 130A and 130B, in accordance with some embodiments. The portion 194 is filled into the trench R3, in accordance with some embodiments. The portion 194 surrounds the chips 130A and 130B and the portion 192, in accordance with some embodiments.

Figure 8A:
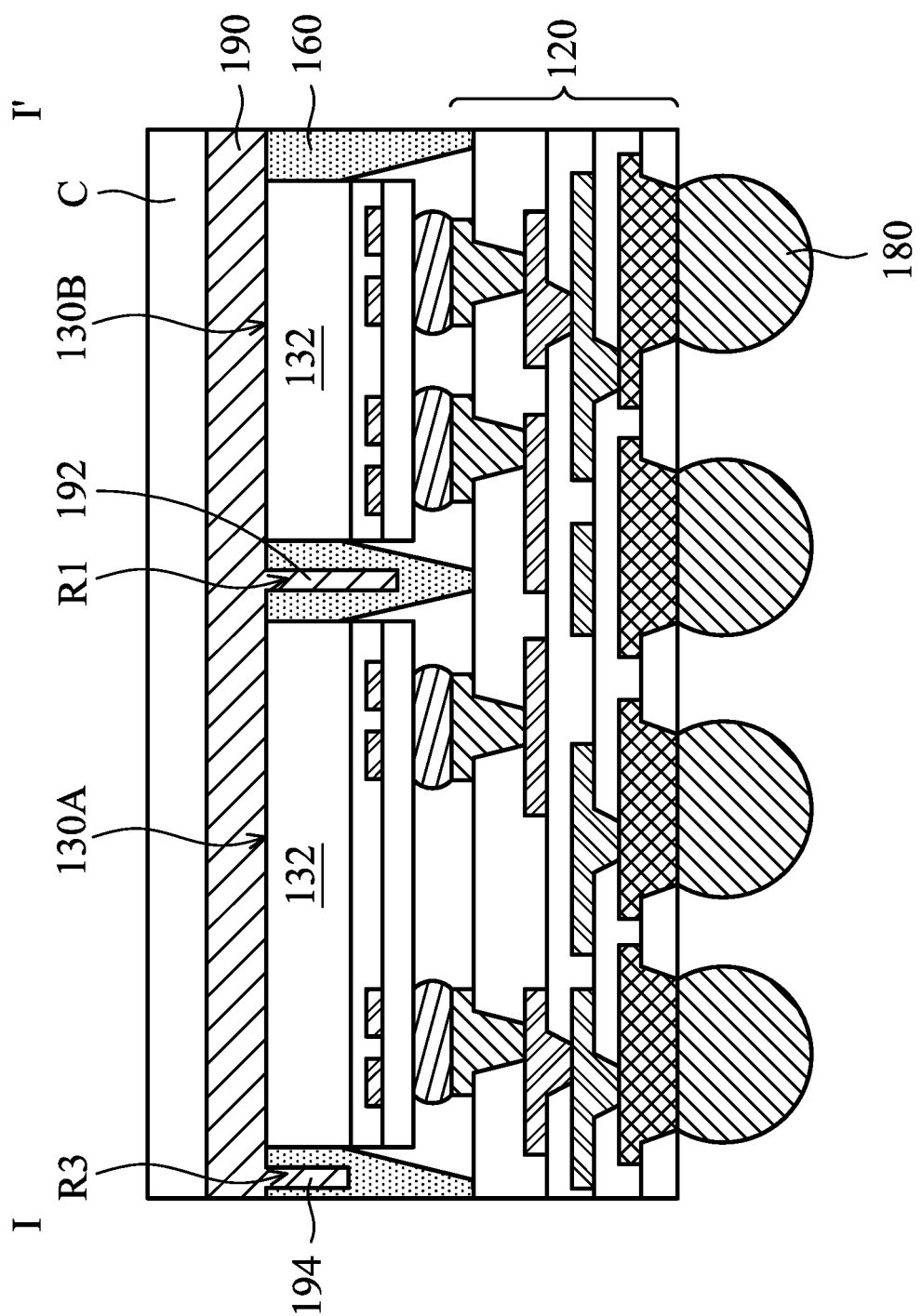
FIG. 8A is a cross-sectional view of a chip package structure, in accordance with some embodiments.
Figure 8B:
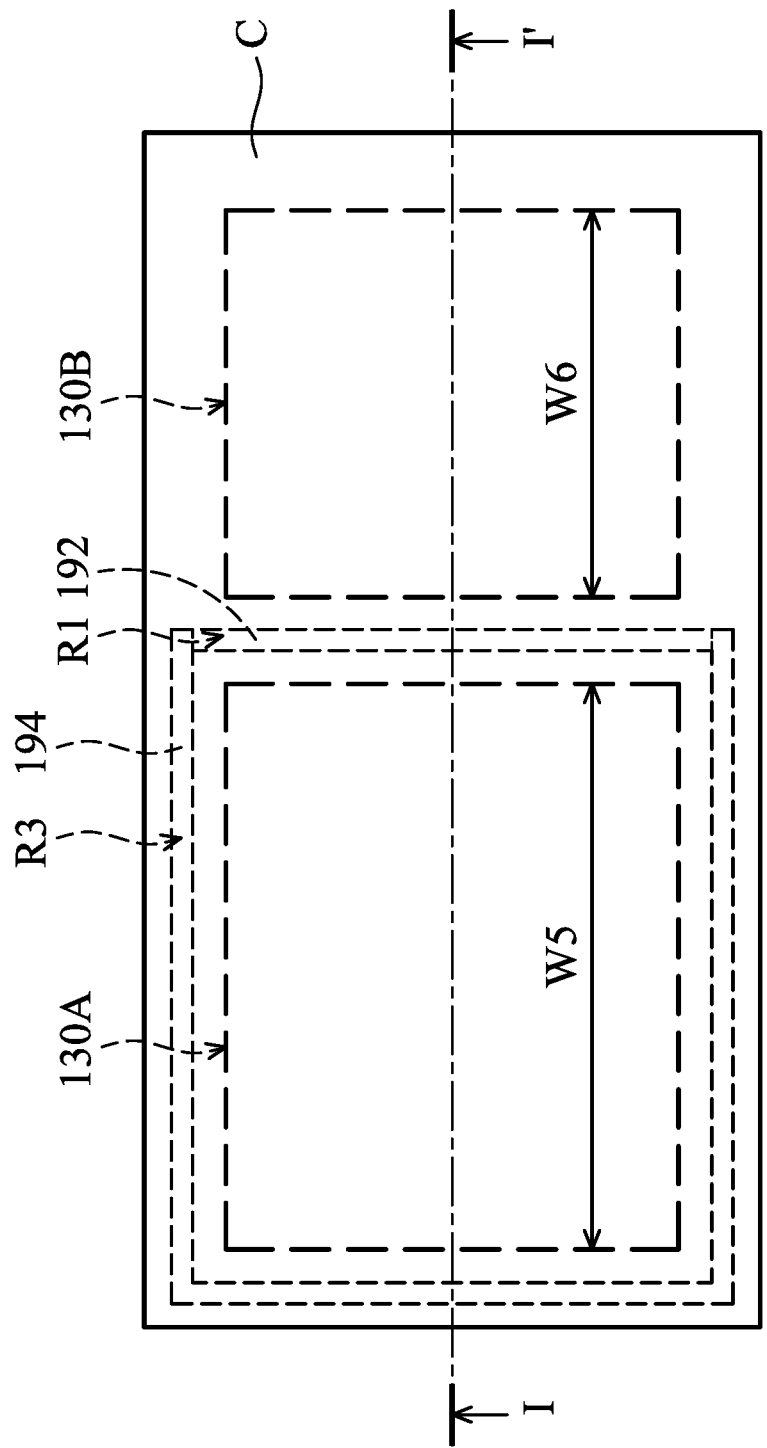
FIG. 8B is a top view of the chip package structures of FIG. 8A, in accordance with some embodiments.

FIG. 8A is a cross-sectional view of a chip package structure 800, in accordance with some embodiments. FIG. 8B is a top view of the chip package structures 800 of FIG. 8A, in accordance with some embodiments. FIG. 8A is a cross-sectional view illustrating the chip package structures 800 along a sectional line I-I' in FIG. 8B, in accordance with some embodiments.

As shown in FIGS. 8A and 8B, the chip package structure 800 is similar to the chip package structure 700 of FIGS. 7B and 7B-1, except that the trench R3 and the portion 194 (of the heat dissipation layer 190) in the trench R3 only surround the chip 130A, in accordance with some embodiments. That is, the trench R3 and the portion 194 in the trench R3 do not surround the chip 130B, in accordance with some embodiments. The width W5 of the chip 130A is greater than the width W6 of the chip 130B, in accordance with some embodiments.

Figure 9A:
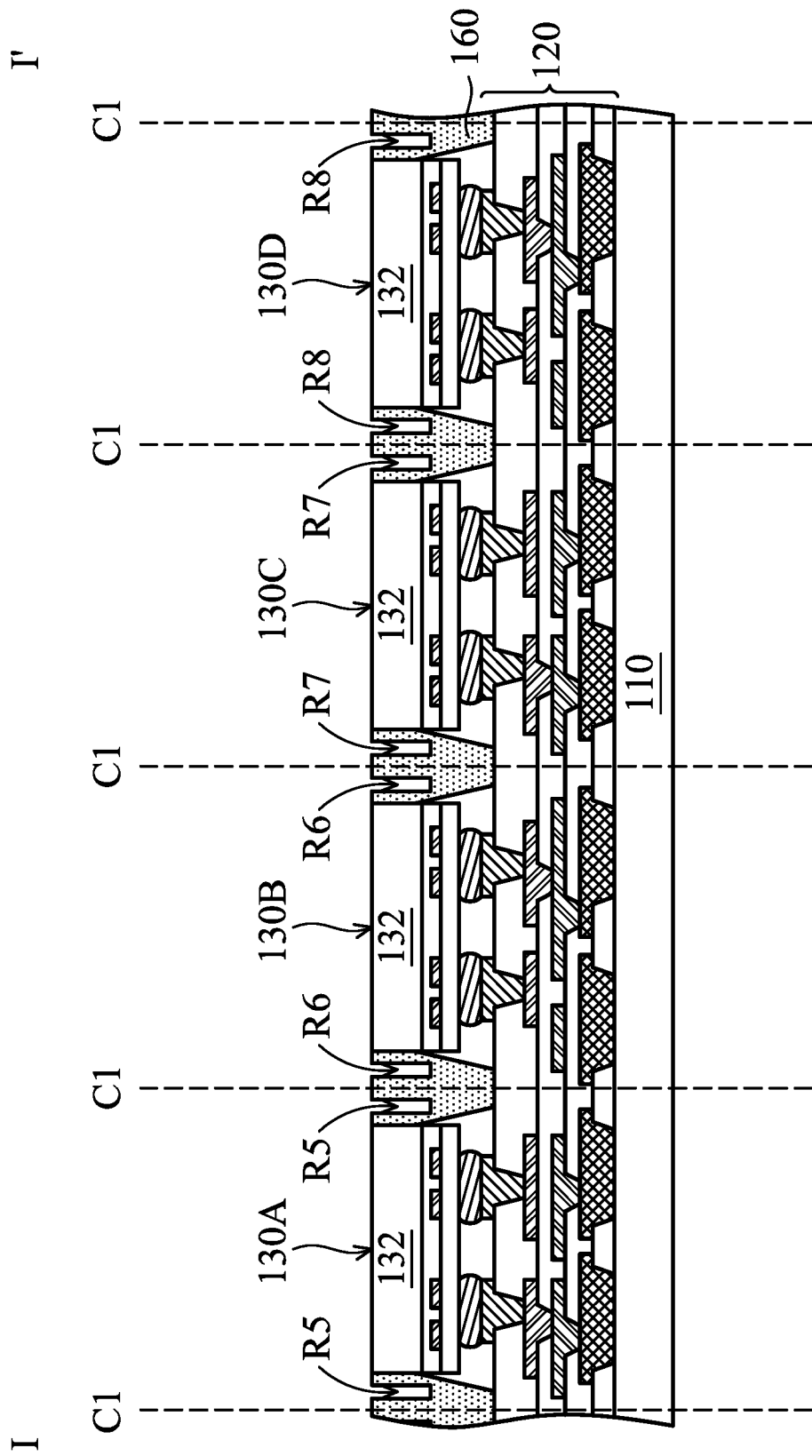
FIGS. 9A-9B are cross-sectional views of various stages of a process for forming a chip package structure, in accordance with some embodiments.
Figures 1, 9A:
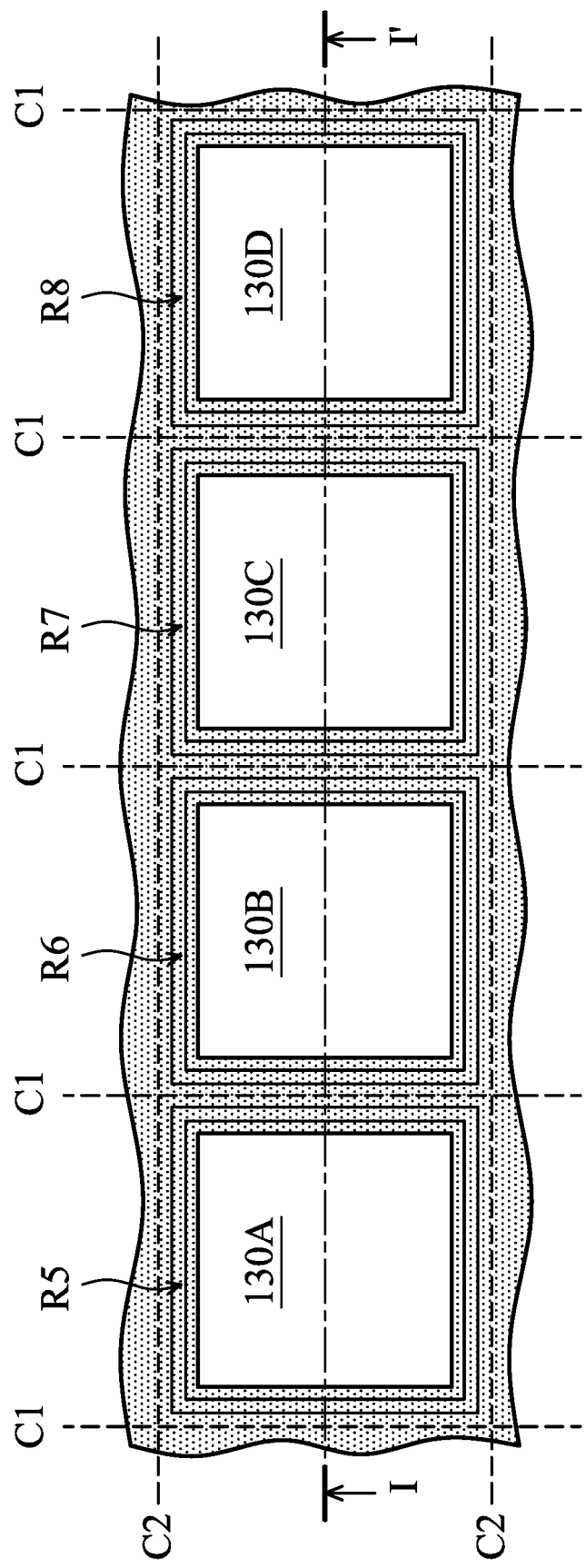
Figures 1, 9B:
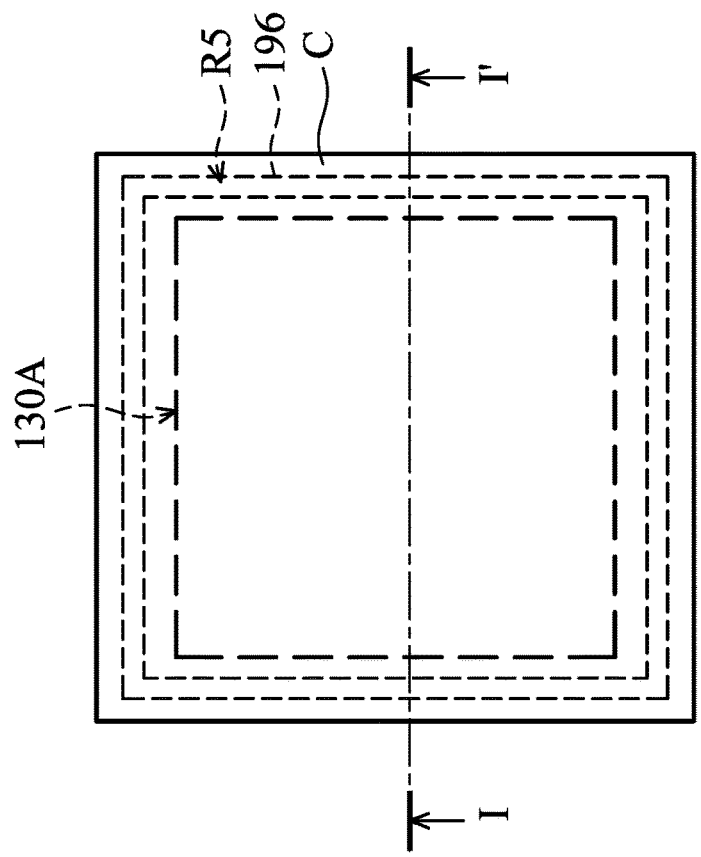
Figure 9B:
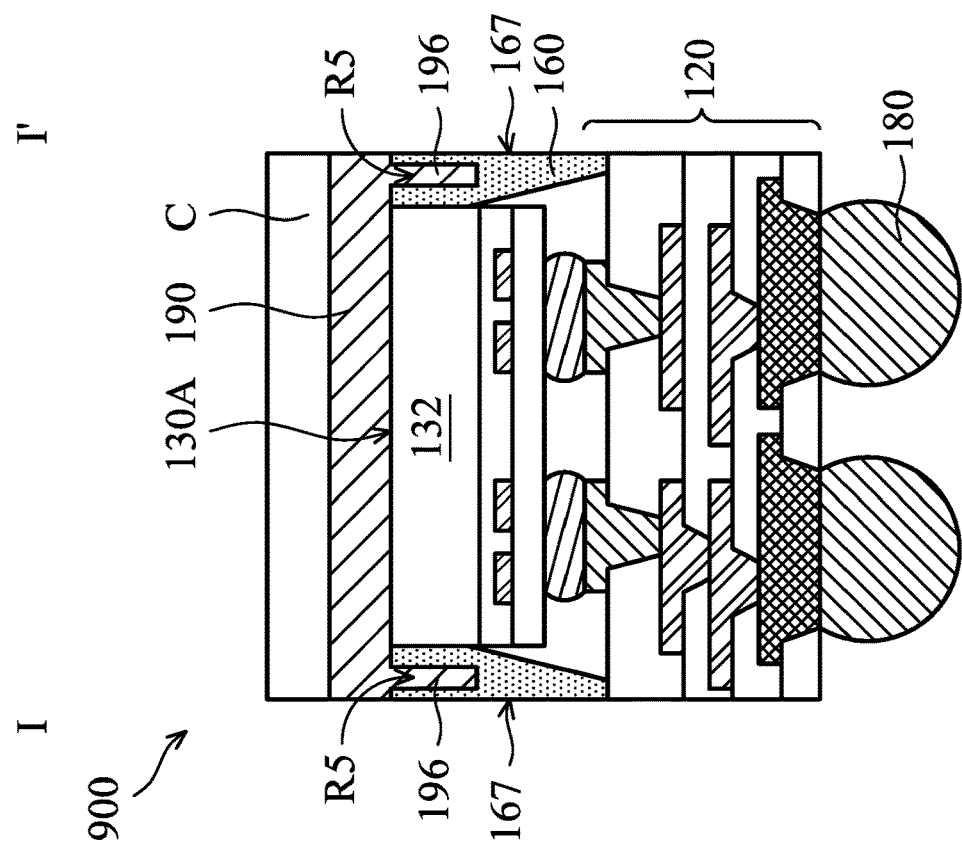

FIGS. 9A-9B are cross-sectional views of various stages of a process for forming a chip package structure 900, in accordance with some embodiments. FIGS. 9A-1 to 9B-1 are top views of the chip package structures 900 of FIGS. 9A-9B, in accordance with some embodiments. FIGS. 9A-9B are cross-sectional views illustrating the chip package structures 900 along a sectional line I-I' in FIGS. 9A-1 to 9B-1, in accordance with some embodiments.

After the step of FIG. 1D, as shown in FIGS. 9A and 9A-1, portions of the molding layer 160 are removed to form trenches R5, R6, R7 and R8 in the molding layer 160, in accordance with some embodiments. The trench R5 surrounds the entire chip 130A, in accordance with some embodiments. The trench R5 is between the chip 130A and the predetermined cutting lines C1 and C2, in accordance with some embodiments. The trench R5 is spaced apart from the chip 130A and the predetermined cutting lines C1 and C2, in accordance with some embodiments.

The trench R6 surrounds the entire chip 130B, in accordance with some embodiments. The trench R6 is between the chip 130B and the predetermined cutting lines C1 and C2, in accordance with some embodiments. The trench R6 is spaced apart from the chip 130B and the predetermined cutting lines C1 and C2, in accordance with some embodiments.

The trench R7 surrounds the entire chip 130C, in accordance with some embodiments. The trench R7 is between the chip 130C and the predetermined cutting lines C1 and C2, in accordance with some embodiments. The trench R7 is spaced apart from the chip 130C and the predetermined cutting lines C1 and C2, in accordance with some embodiments.

The trench R8 surrounds the entire chip 130D, in accordance with some embodiments. The trench R8 is between the chip 130D and the predetermined cutting lines C1 and C2, in accordance with some embodiments. The trench R8 is spaced apart from the chip 130D and the predetermined cutting lines C1 and C2, in accordance with some embodiments. The predetermined cutting lines C1 are between the chips 130A, 130B, 130C, and 130D, in accordance with some embodiments.

After performing the steps of FIGS. 1F-1L, as shown in FIGS. 9B and 9B-1, chip packages 900 are formed, in accordance with some embodiments. For the sake of simplicity, only one of the chip packages 900 is shown in FIGS. 9B and 9B-1, in accordance with some embodiments. The chip package 900 has only one chip 130A, in accordance with some embodiments.

The heat dissipation layer 190 has a portion 196, in accordance with some embodiments. The portion 196 is filled into the trench R5 of the molding layer 160, in accordance with some embodiments. The portion 196 is between the chip 130A and the sidewalls 167 of the molding layer 160, in accordance with some embodiments. The portion 196 surrounds the entire chip 130A, in accordance with some embodiments.

In accordance with some embodiments, chip package structures and methods for forming the same are provided. The methods (for forming the chip package structure) form a trench in a molding layer of a chip package structure. The trench provides a space for accommodating the thermal expansion of the molding layer. Therefore, the warpage of the molding layer is reduced by the trench. As a result, the formation of the trench improves the yield of the chip package structure with the molding layer.

In accordance with some embodiments, a method for forming a chip package structure is provided. The method includes disposing a chip over a redistribution structure. The method includes forming a molding layer over the redistribution structure adjacent to the chip. The method includes partially removing the molding layer to form a trench in the molding layer, and the trench is spaced apart from the chip.

In accordance with some embodiments, a method for forming a chip package structure is provided. The method includes disposing a first chip and a second chip over a redistribution structure. The redistribution structure includes a first insulating layer and a first wiring layer, the first wiring layer is in the first insulating layer and electrically connected to the first chip and the second chip, the redistribution structure has a first surface and a second surface opposite to the first surface, and the first chip and the second chip are over the first surface. The method includes forming a molding layer over the first surface. The molding layer surrounds the first chip and the second chip. The method includes forming a first trench in the molding layer and between the first chip and the second chip. The first trench is spaced apart from the first chip and the second chip.

In accordance with some embodiments, a chip package structure is provided. The chip package structure includes a redistribution structure. The chip package structure includes a first chip over the redistribution structure. The chip package structure includes a molding layer over the redistribution structure and surrounding the first chip. The chip package structure includes a heat dissipation layer over the first chip and the molding layer. A first portion of the heat dissipation layer extends into the molding layer. A first thermal conductivity coefficient of the heat dissipation layer is greater than a second thermal conductivity coefficient of the molding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
    disposing a first chip over a redistribution structure;
    forming an underfill layer between the first chip and the redistribution structure, wherein the underfill layer is in contact with a first sidewall of the first chip;
    forming a molding layer over the redistribution structure and partially covering the first sidewall of the first chip; and
    partially removing the molding layer to form a trench in the molding layer, wherein the trench is spaced apart from the first chip and comprises a first strip-shaped portion, a second strip-shaped portion, and a third strip-shaped portion spaced apart from each other and extending and sequentially arranged in a first direction, and a distance between a bottom surface of the trench to a top surface of the redistribution structure is greater than a distance between a bottom surface of the first chip and the top surface of the redistribution structure, wherein the bottom surface of the trench is positioned on a plane, and the plane passes the underfill layer in a tangent direction that is parallel to a top surface of the redistribution structure; and
    forming a heat dissipation layer on the molding layer and the first chip and in the trench, wherein the heat dissipation layer comprises:
    a first portion overlapping the first chip, and a bottom surface of the first portion is in direct contact with the first chip;
    a second portion laterally protruding from the first portion and the first sidewall of the first chip, wherein a sidewall of the second portion is substantially aligned with a sidewall of the redistribution structure, and a thickness of the second portion is substantially uniform;
    a third portion laterally protruding from the first portion and a second sidewall of the first chip opposite to the first sidewall; and
    an extending portion formed in the first strip-shaped portion, the second strip-shaped portion, and the third strip-shaped portion of the trench and directly below the third portion;
    wherein in a top view:
    the first strip-shaped portion has a first edge and a second edge extending in a second direction different form the first direction;
    a first extension of the first edge is spaced apart from a third sidewall of the first chip;
    a second extension of the second edge passes through the first sidewall and the second sidewall of the first chip.

2. The method for forming the chip package structure as claimed in claim 1, wherein the strip-shaped portions of the trench have different depths.

3. The method for forming the chip package structure as claimed in claim 1, wherein the strip-shaped portions of the trench have an identical depth.

4. The method for forming the chip package structure as claimed in claim 1, wherein in the top view:
    the second strip-shaped portion has a third edge and a fourth edge extending in the second direction;
    a third extension of the third edge passes through the first sidewall and the second sidewall of the first chip;
    a fourth extension of the fourth edge passes through the first sidewall and the second sidewall of the first chip.

5. The method for forming the chip package structure as claimed in claim 4, wherein in the top view:
    the third strip-shaped portion has a fifth edge and a sixth edge extending in the second direction;
    the first edge, the second edge, the third edge, the fourth edge, the fifth edge, and the sixth edge are sequentially arranged in the first direction;
    a fifth extension of the fifth edge passes through the first sidewall and the second sidewall of the first chip;
    a sixth extension of the sixth edge is spaced apart from the first sidewall and the second sidewall of the first chip.

6. The method for forming the chip package structure as claimed in claim 5, wherein in a top view, the chip package structure has a first package edge closer to the third sidewall of the first chip and a second package edge opposite to the first package edge and closer to a fourth sidewall of the first chip, and the extending portion extends to the first package edge and is spaced apart from the second package edge.

7. The method for forming the chip package structure as claimed in claim 5, wherein a distance between the first edge and the sixth edge is greater than a distance between the third sidewall and a fourth sidewall of the first chip.

8. The method for forming the chip package structure as claimed in claim 1, further comprising cutting the redistribution structure and the molding layer through a first cutting line, wherein the trench further comprises a fourth strip-shaped portion, the first strip-shaped portion is between the second strip-shaped portion and the fourth strip-shaped portion, and the first cutting line extends in the second direction and passes through the fourth strip-shaped portion.

9. The method for forming the chip package structure as claimed in claim 8, further comprising cutting the redistribution structure and the molding layer through a second cutting line extending in the second direction, wherein the trench further comprises a fifth strip-shaped portion, and the third strip-shaped portion is between the second strip-shaped portion and the fifth strip-shaped portion, and wherein the second cutting line is between the third strip-shaped portion and the fifth strip-shaped portion and spaced apart from the third strip-shaped portion and the fifth strip-shaped portion.

10. The method for forming the chip package structure as claimed in claim 1, further comprising disposing a second chip over the redistribution structure, wherein the second chip comprises a forth sidewall facing the first sidewall of the first chip, a fifth sidewall opposite to the fourth sidewall, and a sixth sidewall connecting the fourth sidewall and the fifth sidewall, and the first strip-shaped portion, the second strip-shaped portion, and the third strip-shaped portion are between the first sidewall of the first chip and the fourth sidewall of the second chip in the second direction.

11. A method for forming a chip package structure, comprising:
    disposing a first chip and a second chip over a first side of a redistribution structure, wherein the redistribution structure comprises an insulating layer and a wiring layer, the wiring layer is in the insulating layer and electrically connected to the first chip and the second chip;
    forming a underfill layer between the first chip and the redistribution layer;
    forming a molding layer over the redistribution structure and covering the underfill layer, wherein the molding layer surrounds and physically contacts the first chip and the second chip;

forming a trench in the molding layer and between the first chip and the second chip, wherein the trench is spaced apart from the first chip and the second chip;

forming a tape layer in contact with a top surface of the first chip and a top surface of the second chip after forming the trench in the molding layer;

forming conductive bumps over a second side of the redistribution structure;

removing the tape layer after forming the conductive bumps;

cutting the redistribution structure and the molding layer through a first cutting line and a second cutting line after removing the tape layer, wherein in a top view, the first cutting line and the trench are perpendicular, the second cutting line and the trench are parallel, and the first cutting line passes through the trench, so that the trench is separated into two portions, wherein the second cutting line is spaced apart from the trench; and after cutting the redistribution structure and the molding layer, forming a heat dissipation layer on the molding layer and in the trench, wherein the heat dissipation layer comprises:
a first portion overlapping the first chip;
a second portion laterally extending from the first portion; and
an extending portion formed in the trench and being strip-shaped, wherein the extending portion extends to an edge of the chip package structure, and a thickness of the extending portion is less than a thickness of the first chip;

wherein a bottom surface of the second portion is substantially flat, and an edge sidewall of the second portion is directly connected to the bottom surface of the second portion and is substantially aligned with an edge sidewall of the molding layer.

12. The method for forming the chip package structure as claimed in claim 11, further comprising cutting the redistribution structure and the molding layer through a second cutting line, wherein in a top view, the second cutting line is spaced apart from first chip and the trench, and the first cutting line and the second cutting line are at opposite sides of the first chip.

13. The method for forming the chip package structure as claimed in claim 11, wherein the extending portion and the second portion of the heat dissipation layer are positioned at opposite sides of the first portion of the heat dissipation layer.

14. The method for forming the chip package structure as claimed in claim 11, wherein a first distance between the extending portion and the first chip is different from a second distance between the extending portion and the second chip.

* * * * *